(12) United States Patent
Carlson

(10) Patent No.: US 11,393,843 B2
(45) Date of Patent: Jul. 19, 2022

(54) CHARGE TRAP STRUCTURE WITH BARRIER TO BLOCKING REGION

(71) Applicant: Micron Technology, Inc., Boise, ID (US)

(72) Inventor: Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/856,976

(22) Filed: Apr. 23, 2020

(65) Prior Publication Data

US 2020/0258906 A1   Aug. 13, 2020

Related U.S. Application Data

(62) Division of application No. 15/675,223, filed on Aug. 11, 2017, now Pat. No. 10,680,006.

(51) Int. Cl.
*H01L 27/11582* (2017.01)
*H01L 21/28* (2006.01)
*H01L 29/423* (2006.01)

(52) U.S. Cl.
CPC .. *H01L 27/11582* (2013.01); *H01L 29/40117* (2019.08); *H01L 29/4234* (2013.01)

(58) Field of Classification Search
CPC .......... H01L 27/11582; H01L 29/0649; H01L 27/11568; H01L 27/11565; H01L 45/10; H01L 27/2418; H01L 27/2463; H01L 45/1233; H01L 45/145; H01L 45/146; H01L 45/165; H01L 29/7926; H01L 27/1157; H01L 29/66833

USPC .... 257/324, 319, E21.21, E29.309; 438/269, 438/264, 588

See application file for complete search history.

(56) References Cited

U.S. PATENT DOCUMENTS

| | | | |
|---|---|---|---|
| 5,292,677 A | 3/1994 | Dennison | |
| 6,674,138 B1 | 1/2004 | Halliyal et al. | |
| 7,052,967 B2 | 5/2006 | Lee et al. | |
| 7,804,120 B2 | 9/2010 | Lee et al. | |
| 7,999,304 B2 | 8/2011 | Ozawa et al. | |
| 8,034,693 B2 | 10/2011 | Shibata et al. | |
| 8,148,789 B2 | 4/2012 | Kito et al. | |

(Continued)

FOREIGN PATENT DOCUMENTS

| | | |
|---|---|---|
| CN | 111149203 A | 5/2020 |
| CN | 111149205 A | 5/2020 |

(Continued)

OTHER PUBLICATIONS

US 11,004,859 B2, 05/2021, Carlson et al. (withdrawn)

(Continued)

*Primary Examiner* — Mouloucoulaye Inoussa
(74) *Attorney, Agent, or Firm* — Schwegman Lundberg & Woessner, P.A.

(57) ABSTRACT

Various embodiments, disclosed herein, include methods and apparatus having charge trap structures, where each charge trap structure includes a dielectric barrier between a gate and a blocking dielectric on a charge trap region of the charge trap structure. In various embodiments, material of the dielectric barrier of each of the charge trap structures may have a dielectric constant greater than that of aluminum oxide. Additional apparatus, systems, and methods are disclosed.

20 Claims, 15 Drawing Sheets

(56) References Cited

U.S. PATENT DOCUMENTS

| | | |
|---|---|---|
| 9,129,789 B2 | 9/2015 | Krutchinsky et al. |
| 9,136,128 B2 | 9/2015 | Lee et al. |
| 9,177,966 B1 | 11/2015 | Rabkin et al. |
| 9,343,316 B2 | 5/2016 | Lee et al. |
| 9,406,694 B1 | 8/2016 | Ikeno et al. |
| 9,570,464 B1 | 2/2017 | Wakatsuki et al. |
| 9,679,778 B2 | 6/2017 | Lee et al. |
| 9,679,907 B1 | 6/2017 | Kaneko |
| 9,748,262 B1 | 8/2017 | Lai et al. |
| 9,960,045 B1 | 5/2018 | Purayath et al. |
| 9,997,533 B2 | 6/2018 | Yoshimizu et al. |
| 10,134,597 B2 | 11/2018 | Lee et al. |
| 10,164,009 B1 | 12/2018 | Carlson |
| 10,446,572 B2 | 10/2019 | Carlson |
| 10,453,855 B2 | 10/2019 | Carlson et al. |
| 10,644,105 B2 | 5/2020 | Carlson |
| 10,651,282 B2 | 5/2020 | Lee et al. |
| 10,680,006 B2 | 6/2020 | Carlson |
| 10,937,802 B2 | 3/2021 | Carlson |
| 10,985,251 B2 | 4/2021 | Lee et al. |
| 11,037,951 B2 | 6/2021 | Carlson et al. |
| 2002/0008261 A1 | 1/2002 | Nishiyama |
| 2003/0030099 A1 | 2/2003 | Hsieh et al. |
| 2007/0184615 A1 | 8/2007 | Brazzelli et al. |
| 2007/0257305 A1 | 11/2007 | Sasago et al. |
| 2007/0296016 A1 | 12/2007 | Nagano et al. |
| 2008/0012061 A1 | 1/2008 | Ichige et al. |
| 2008/0054341 A1 | 3/2008 | Natori et al. |
| 2008/0197403 A1 | 8/2008 | Ozawa et al. |
| 2008/0246078 A1 | 10/2008 | Huo et al. |
| 2008/0283898 A1 | 11/2008 | Kuniya |
| 2009/0101883 A1 | 4/2009 | Lai et al. |
| 2009/0212351 A1 | 8/2009 | Chen |
| 2009/0302367 A1 | 12/2009 | Nagano |
| 2010/0003795 A1 | 1/2010 | Park et al. |
| 2010/0019311 A1 | 1/2010 | Sato et al. |
| 2010/0044772 A1 | 2/2010 | Yonemochi et al. |
| 2010/0078758 A1 | 4/2010 | Sekar et al. |
| 2010/0133525 A1 | 6/2010 | Arai et al. |
| 2010/0176368 A1 | 7/2010 | Ko et al. |
| 2010/0176438 A1 | 7/2010 | Lue et al. |
| 2010/0187593 A1 | 7/2010 | Morikado |
| 2010/0190330 A1 | 7/2010 | Yonemochi et al. |
| 2010/0213537 A1 | 8/2010 | Fukuzumi et al. |
| 2010/0295113 A1 | 11/2010 | Kang et al. |
| 2011/0097887 A1 | 4/2011 | Aoyama et al. |
| 2011/0104883 A1 | 5/2011 | Nagano |
| 2011/0108905 A1 | 5/2011 | Ichige et al. |
| 2011/0193153 A1 | 8/2011 | Higuchi et al. |
| 2011/0298013 A1 | 12/2011 | Hwang et al. |
| 2011/0300703 A1 | 12/2011 | Sato et al. |
| 2011/0303967 A1 | 12/2011 | Harari et al. |
| 2011/0309425 A1 | 12/2011 | Purayath et al. |
| 2011/0309426 A1 | 12/2011 | Purayath et al. |
| 2011/0309430 A1 | 12/2011 | Purayath et al. |
| 2012/0001252 A1 | 1/2012 | Alsmeier et al. |
| 2012/0012920 A1 | 1/2012 | Shin et al. |
| 2012/0049268 A1 | 3/2012 | Chang et al. |
| 2012/0126302 A1 | 5/2012 | Noda et al. |
| 2012/0126303 A1 | 5/2012 | Arai et al. |
| 2012/0187467 A1 | 7/2012 | Rogers et al. |
| 2012/0213006 A1 | 8/2012 | Isomura et al. |
| 2012/0256247 A1 | 10/2012 | Alsmeier |
| 2012/0280303 A1 | 11/2012 | Kiyotoshi et al. |
| 2012/0319172 A1 | 12/2012 | Ramaswamy et al. |
| 2013/0049093 A1 | 2/2013 | Lee et al. |
| 2013/0056819 A1 | 3/2013 | Matsushita et al. |
| 2013/0134493 A1 | 5/2013 | Eom et al. |
| 2013/0256781 A1 | 10/2013 | Paek et al. |
| 2013/0270625 A1 | 10/2013 | Jang et al. |
| 2014/0008714 A1 | 1/2014 | Makala et al. |
| 2014/0131785 A1 | 5/2014 | Seo et al. |
| 2015/0069494 A1 | 3/2015 | Makala et al. |
| 2015/0091078 A1 | 4/2015 | Jang et al. |
| 2015/0137062 A1 | 5/2015 | Ananthan et al. |
| 2015/0243675 A1* | 8/2015 | Lim .................. H01L 27/11582 257/324 |
| 2015/0263036 A1 | 9/2015 | Yasuda |
| 2015/0348790 A1 | 12/2015 | Lee et al. |
| 2015/0380431 A1 | 12/2015 | Kanamori et al. |
| 2016/0093636 A1 | 3/2016 | Pang et al. |
| 2016/0133752 A1 | 5/2016 | Hopkins et al. |
| 2016/0181273 A1 | 6/2016 | Kim et al. |
| 2016/0254159 A1 | 9/2016 | Lee et al. |
| 2016/0343657 A1 | 11/2016 | Sawa et al. |
| 2016/0351582 A1* | 12/2016 | Kim .................. H01L 27/11582 |
| 2017/0062330 A1 | 3/2017 | Kim et al. |
| 2017/0062471 A1* | 3/2017 | Son .................. H01L 27/11582 |
| 2017/0069637 A1 | 3/2017 | Son et al. |
| 2017/0098659 A1 | 4/2017 | Yoshimizu et al. |
| 2017/0117290 A1 | 4/2017 | Lee et al. |
| 2017/0141122 A1 | 5/2017 | Yoshimizu et al. |
| 2017/0200737 A1 | 7/2017 | Sun et al. |
| 2017/0229474 A1* | 8/2017 | Shimizu ............ H01L 27/11568 |
| 2017/0278851 A1* | 9/2017 | Fujii ........................ H01L 28/00 |
| 2017/0287719 A1 | 10/2017 | Lee et al. |
| 2017/0373086 A1 | 12/2017 | Pang et al. |
| 2018/0286874 A1 | 10/2018 | Kim et al. |
| 2019/0051656 A1 | 2/2019 | Carlson et al. |
| 2019/0051660 A1 | 2/2019 | Carlson |
| 2019/0051661 A1 | 2/2019 | Carlson |
| 2019/0109190 A1 | 4/2019 | Carlson |
| 2019/0157092 A1 | 5/2019 | Lee et al. |
| 2019/0312058 A1 | 10/2019 | Carlson |
| 2020/0020703 A1 | 1/2020 | Carlson et al. |
| 2020/0258980 A1 | 8/2020 | Carlson |
| 2020/0279928 A1 | 9/2020 | Lee et al. |
| 2021/0202521 A1 | 7/2021 | Carlson |
| 2021/0265365 A1 | 8/2021 | Carlson et al. |

FOREIGN PATENT DOCUMENTS

| | | |
|---|---|---|
| CN | 111149207 A | 5/2020 |
| CN | 111164756 A | 5/2020 |
| JP | 2009081316 A | 4/2009 |
| JP | 2011082581 A | 4/2011 |
| JP | 2012248691 A | 12/2012 |
| JP | 2014096466 A | 5/2014 |
| JP | 2015177013 A | 10/2015 |
| JP | 2016225434 A | 12/2016 |
| JP | 2017139036 A | 8/2017 |
| KR | 101017713 B1 | 2/2011 |
| KR | 20110034816 A | 4/2011 |
| KR | 20110074749 A | 7/2011 |
| KR | 20120007838 U | 11/2012 |
| KR | 20130109289 A | 10/2013 |
| KR | 20130116607 A | 10/2013 |
| KR | 20140060206 A | 5/2014 |
| KR | 20150085735 A | 7/2015 |
| KR | 20170026815 A | 3/2017 |
| KR | 20170029795 A | 3/2017 |
| KR | 102335220 B1 | 12/2021 |
| TW | 486773 | 5/2002 |
| TW | 201244007 | 11/2012 |
| TW | 201705451 A | 2/2017 |
| TW | 201911581 A | 3/2019 |
| TW | 201921639 A | 6/2019 |
| TW | 201921652 A | 6/2019 |
| TW | 201921654 A | 6/2019 |
| WO | WO-2016191155 A1 | 12/2016 |
| WO | WO-2019032323 A1 | 2/2019 |
| WO | WO-2019032326 A1 | 2/2019 |
| WO | WO-2019032373 A1 | 2/2019 |
| WO | WO-2019032376 A1 | 2/2019 |

OTHER PUBLICATIONS

"International Application Serial No. PCT/US2018/044353, International Preliminary Report on Patentability dated Feb. 20, 2020", 8 pgs.

"International Application Serial No. PCT/US2018/044375, International Preliminary Report on Patentability dated Feb. 2, 2020", 16 pgs.

(56) References Cited

OTHER PUBLICATIONS

"International Application Serial No. PCT/US2018/044990, International Preliminary Report on Patentability dated Feb. 2, 2020", 11 pgs.
"International Application Serial No. PCT/US2018/045015, International Preliminary Report on Patentability dated Feb. 2, 2020", 13 pgs.
"Taiwanese Application Serial No. 107127000, Response filed Nov. 29, 2019 to Office Action dated Aug. 29, 2019", w/ English Claims, 85 pgs.
"Taiwanese Application Serial No. 107127913, Office Action dated May 3, 2019", W/ English Translation, 21 pgs.
"Taiwanese Application Serial No. 107127913, Response filed Nov. 6, 2019 to Office Action dated May 3, 2019", w/ English Claims, 75 pgs.
"Taiwanese Application Serial No. 107127922, Office Action dated Nov. 25, 2019", w/ English Translation, 73 pgs.
"Taiwanese Application Serial No. 107127922, Response filed Feb. 27, 2020 to Office Action dated Nov. 25, 2019", w/ English Claims, 41 pgs.
"Taiwanese Application Serial No. 107127992, Response filed Nov. 29, 2019 to Office Action dated Aug. 29, 2019", w/ English Claims, 11 pgs.
U.S. Appl. No. 13/222,367, U.S. Pat. No. 9,136,128, filed Aug. 31, 2011, Methods and Apparatuses Including Memory Cells With Air Gaps and Other Low Dielectric Constant Materials.
U.S. Appl. No. 14/825,947, U.S. Pat. No. 9,343,316, filed Aug. 13, 2015, Methods of Forming Memory Cells With Air Gaps and Other Low Dielectric Constant Materials.
U.S. Appl. No. 15/154,467, U.S. Pat. No. 9,679,778, filed May 13, 2016, Methods of Forming Memory Cells With Air Gaps and Other Low Dielectric Constant Materials.
U.S. Appl. No. 15/620,458, U.S. Pat. No. 10,134,597, filed Jun. 12, 2017, Apparatuses Including Memory Cells With Gaps Comprising Low Dielectric Constant Materials.
U.S. Appl. No. 16/168,470, U.S. Pat. No. 10,651,282, filed Oct. 23, 2018, Apparatuses Including Memory Cells With Gaps Comprising Low Dielectric Constant Materials.
U.S. Appl. No. 16/871,600, filed May 11, 2020, Apparatuses Including Memory Cells With Gaps Compromising Low Dielectric Constant Materials.
U.S. Appl. No. 15/675,223, filed Aug. 11, 2017, Charge Trap Structure With Barrier to Blocking Region.
U.S. Appl. No. 15/675,197, U.S. Pat. No. 10,446,572, filed Aug. 11, 2017, Void Formation for Change Trap Structures.
U.S. Appl. No. 16/452,292, filed Jun. 25, 2019, Void Formation for Charge Trap Structures.
U.S. Appl. No. 15/675,265, U.S. Pat. No. 10,453,855, filed Aug. 11, 2017, Void Formation in Charge Trap Structures.
U.S. Appl. No. 16/580,751, filed Sep. 24, 2019, Void Formation in Charge Trap Structures.
U.S. Appl. No. 15/675,130, U.S. Pat. No. 10,164,009, filed Aug. 11, 2017, Memory Device Including Voids Between Control Gates.
U.S. Appl. No. 16/197,217, U.S. Pat. No. 10,644,105, filed Nov. 20, 2018, Memory Device Including Voids Between Control Gates.
U.S. Appl. No. 16/863,117, filed Apr. 30, 2020, Memory Device Including Voids Between Control Gates.
"Taiwanese Application Serial No. 107127922, Decision of Rejection dated Jul. 10, 2020", 12 pgs.
"International Application Serial No. PCT/US2018/044353, International Search Report dated Nov. 14, 2018", 3 pgs.
"International Application Serial No. PCT/US2018/044353, Written Opinion dated Nov. 14, 2018", 6 pgs.
"International Application Serial No. PCT/US2018/044375, International Search Report dated Nov. 16, 2018", 3 pgs.
"International Application Serial No. PCT/US2018/044375, Written Opinion dated Nov. 16, 2018", 14 pgs.
"International Application Serial No. PCT/US2018/044990, International Search Report dated Dec. 7, 2018", 3 pgs.
"International Application Serial No. PCT/US2018/044990, Written Opinion dated Dec. 7, 2018", 9 pgs.
"International Application Serial No. PCT/US2018/045015, International Search Report dated Nov. 23, 2018", 3 pgs.
"International Application Serial No. PCT/US2018/045015, Written Opinion dated Nov. 23, 2018", 10 pgs.
"Taiwanese Application Serial No. 107127000, Office Action dated Aug. 29, 2019", w/ English Translation, 28 pgs.
"Taiwanese Application Serial No. 107127922, First Office Action dated Apr. 19, 2019", W/ English Translation of Search Report and English Claims, 31 pgs.
"Taiwanese Application Serial No. 107127922, Response filed Jul. 18, 2019 to First Office Action dated Apr. 19, 2019", w/ English Claims, 38 pgs.
"Taiwanese Application Serial No. 107127992, Office Action dated Aug. 29, 2019", w/ English Translation, 18 pgs.
Daycock, David A, et al., "U.S. Appl. No. 15/422,335, Memory Arrays, and Methods of Forming Memory Arrays filed Feb. 1, 2017.", 39 pgs.
Kanarik, Keren J, et al., "Overview of atomic layer etching in the semiconductor industry", J Vac Sci Technol. A, vol. 33 No. 2, (2015), 14 pgs.
Lee, Younghee, et al., "Atomic Layer Etching of Al2O3 Using Sequestial Self-Limiting Thermal Reactions with Sn acac2 and Hydrogen Fluoride", American Chemical Society vol. 9 No. 2, (2015), 2061-2070.
Lee, Younghee, et al., "Atomic Layer Etching of HfO2 Using Sequential, Self-Limiting Thermal Reactions with Sn acac2 and HF", ECS Journal of Solid Science and Technology 4 (6), (Mar. 12, 2015), 20 pgs.
Tsukamoto, Keisuke, et al., "Advanced Air Gap Process for Multi-Level-Cell Flash Memories Reducing Threshold Voltage Interference and Realizing High Reliability", Jpn. J. Appl. Phys. 46, (2007), 1.
"European Application Serial No. 18843408.8, Response filed Sep. 28, 2020 to Communication pursuant to Rule 161(1) and 162 EPC dated Mar. 18, 2020", 29 pgs.
"European Application Serial No. 18843748.7, Response filed Sep. 28, 2020 to Communication pursuant to Rules 161(2) and 162 EPC dated Mar. 18, 2020", 24 pgs.
"European Application Serial No. 18843931.9, Response filed Sep. 28, 2020 to Communication pursuant to Rules 161(2) and 162 EPC Mar. 18, 2020", 22 pgs.
"European Application Serial No. 18844515.9, Response filed Oct. 5, 2020 to Communication pursuant to Rules 161(2) and 162 EPC dated Mar. 26, 2020", 15 pgs.
"Korean Application Serial No. 10-2020-7007242, Response filed Mar. 30, 2021 to Notice of Preliminary Rejection dated Jan. 31, 2021", w English Claims, 25 pgs.
"Korean Application Serial No. 10-2020-7006704, Response filed Mar. 31, 2021 to Notice of Preliminary Rejection dated Jan. 31, 2021", w English Claims, 21 pgs.
"Japanese Application Serial No. 2020-506987, Voluntary Amendment filed Mar. 24, 2021", w/English Claims, 17 pgs.
"Korean Application Serial No. 10-2020-7006550, Response filed Mar. 24, 2021 to Notice of Preliminary Rejection dated Jan. 31, 2021", w/English Claims, 27 pgs.
"Korean Application Serial No. 10-2020-7007082, Response filed Mar. 31, 2021 to Notice of Preliminary Rejection dated Jan. 31, 2021", w/English Claims, 18 pgs.
"Singapore Application Serial No. 11202001075P, Search Report and Written Opinion datd Apr. 27, 2021", 9 pgs.
"European Application Serial No. 18843408.8, Extended European Search Report dated Apr. 7, 2021", 7 pgs.
"European Application Serial No. 18843748.7, Extended European Search Report dated Apr. 9, 2021", 11 pgs.
"European Application Serial No. 18843931.9, Extended European Search Report dated Apr. 9, 2021", 9 pgs.
Nyns, Laura, et al., "Impact of precursor chemistry on atomic layer deposition of lutetium aluminates", Journal of Vacuum Science and Technology: Part A. AVS /AIP, Melville, NY., US, vol. 30, No. 1, (Jan. 1, 2012), 1A120-1A120.

(56) References Cited

OTHER PUBLICATIONS

"European Application Serial No. 18844515.9, Extended European Search Report dated May 17, 2021", 9 pgs.
"Japanese Application Serial No. 2020-506985, Notification of Reasons for Refusal dated May 11, 2021", w/ English translation, 13 pgs.
"Japanese Application Serial No. 2020-506986, Notification of Reasons for Refusal dated May 25, 2021", w/ English translation, 11 pgs.
"Japanese Application Serial No. 2020-506987, Notification of Reasons for Refusal dated May 25, 2021", w/ English translation, 14 pgs.
"Japanese Application Serial No. 2020-507575, Notification of Reasons for Refusal dated Jul. 6, 2021", w/ English translation, 11 pgs.
"Korean Application Serial No. 10-2020-7006550, Notice of Preliminary Rejection dated Jan. 31, 2021", w/ English translation, 23 pgs.
"Korean Application Serial No. 10-2020-7006704, Notice of Preliminary Rejection dated Jan. 31, 2021", w/ English translation, 17 pgs.
"Singaporean Application Serial No. 11202001123P, Written Opinion dated May 14, 21", 10 pgs.
"Japanese Application Serial No. 2020-506985, Response filed Aug. 10, 2021 to Notification of Reasons for Refusal dated May 11, 2021", w/ English Claims, 38 pgs.
"Japanese Application Serial No. 2020-506986, Response filed Oct. 22, 2021 to Notification of Reasons for Refusal dated May 25, 2021", w/ English Claims, 24 pgs.
"Japanese Application Serial No. 2020-506987, Examiners Decision of Final Refusal dated Oct. 12, 2021", w/ English translation, 10 pgs.
"Japanese Application Serial No. 2020-506987, Response filed Aug. 24, 2021 to Notification of Reasons for Refusal dated May 25, 2021", w/ English Claims, 18 pgs.
"Korean Application Serial No. 10-2020-7007082, Notice of Preliminary Rejection dated Aug. 31, 2021", w/ English translation, 22 pgs.
"Korean Application Serial No. 10-2020-7007242, Notice of Preliminary Rejection dated Aug. 25, 2021", w/ English translation, 17 pgs.
"Japanese Application Serial No. 2020-506985, Notification of Reasons for Refusal dated Jan. 11, 2022", w/ English translation, 6 pgs.
"Japanese Application Serial No. 2020-507575, Final Notification of Reasons for Refusal dated Feb. 15, 2022", w/ English translation, 7 pgs.
"Japanese Application Serial No. 2020-507575, Response filed Sep. 22, 2021 to Notification of Reasons for Refusal dated Jul. 6, 2021", w/ English Claims, 23 pgs.

\* cited by examiner

|      | K    | BAND GAP | X   |
|------|------|----------|-----|
| SiO2 | 3.9  | 9.0      | 0.9 |
| SiN  | 7.5  | 5.0      | 1.9 |
| AlOx | 9.0  | 8.0      | 2.8 |
| HfO2 | 20.0 | 4.0      | 2.1 |

US 11,393,843 B2

CHARGE TRAP STRUCTURE WITH BARRIER TO BLOCKING REGION

PRIORITY APPLICATION

This application is a divisional of U.S. application Ser. No. 15/675,223, filed Aug. 11, 2017, which is incorporated herein by reference in its entirety.

BACKGROUND

The electronics industry is under constant pressure to both reduce component size as well as power requirements and has a market driven need to improve operation of memory devices. One approach to reduce component size is to fabricate devices in a three-dimensional (3D) configuration. For example, a memory device can be arranged as a stack of memory cells vertically on a substrate. Such memory cells can be implemented as charge trap cells. Improvements to charge trap based memory devices and their operation can be addressed by advances in design of the memory devices.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

The term "horizontal" as used in this document is defined as a plane parallel to the conventional plane or surface of a substrate, such as that of an underlying a wafer or die, regardless of the actual orientation of the substrate at any point in time. The term "vertical" refers to a direction perpendicular to the horizontal as defined above. The terms "wafer" and "substrate" are used herein to refer generally to any structure on which integrated circuits are formed, and also to such structures during various stages of integrated circuit fabrication. A wafer may include a number of die in which an integrated circuit is disposed with respect to a respective substrate of the die.

Figure 1A:
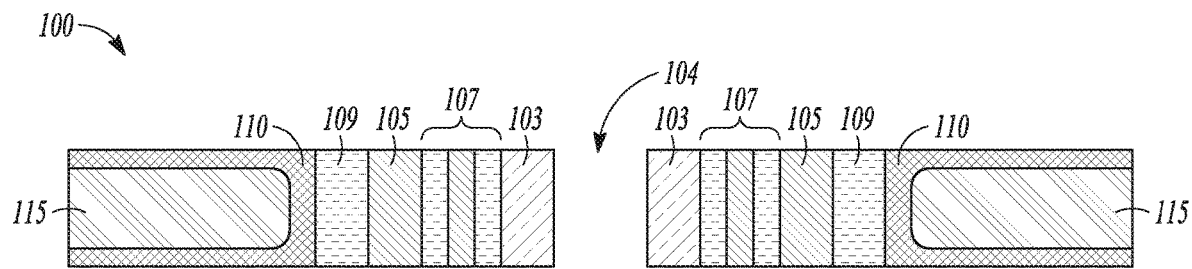
FIG. 1A is a cross-sectional representation of an example charge trap structure, which can be included in a variety of electronic apparatus, according to various embodiments.
Figure 1B:
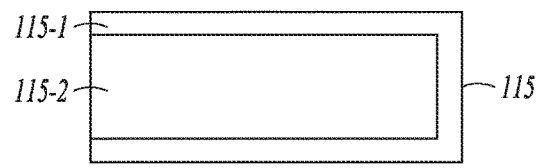
FIG. 1B is a cross-sectional representation of an example gate having a structure with multiple components, according to various embodiments.

FIG. 1A is a cross-sectional representation of an embodiment of an example charge trap (CT) structure 100, which can be included in a variety of electronic apparatus. Such apparatus can include a memory array, a memory device, an integrated circuit, or other apparatus that includes one or more cells to store charge. The CT structure 100 can include a semiconductor pillar 103, a charge trap region 105, a tunnel region 107, a dielectric blocking region 109, a dielectric barrier 110, and a gate 115. The figures herein are not drawn to scale. Semiconductor pillar 103 is operable to conduct a current and gate 115 is operable to control storage of charge in the charge storage region. Gate 115 can be a metal gate. Gate 115 can include conductive titanium nitride. FIG. 1B is a cross-sectional representation of gate 115 having a structure with multiple components. Gate 115 can include conductive titanium nitride, or other metallic compound, with a metal on and contacting the conductive titanium nitride, or other metallic compound. For example, gate 115 can include a conductive TiN barrier layer 115-1 of approximately 15 to 30 Angstroms on which tungsten 115-2 is disposed. Gate 115 can be referred to as a control gate and dielectric blocking region 109 can be referred to as a control dielectric.

Semiconductor pillar 103 can include, but is not limited to, polycrystalline silicon (poly silicon). The regions of structure 100 shown in FIG. 1A can be arranged as rings of material around center region 104. Center region 104 can be a region of dielectric material, such as, but not limited to, a dielectric oxide. An example of a dielectric oxide in center region 104 includes silicon oxide.

Charge trap region 105 is separated from the semiconductor pillar 103 by a tunnel region 107. Charge trap region 105 can be dielectric material that can store charge from semiconductor pillar 103. Charge trap region 105 can be a dielectric nitride region such as a region including dielectric silicon nitride. Other dielectric materials for charge trap region 105 can be used to trap charge. Tunnel region 107 can be constructed as an engineered region to meet a selected criterion associated with charge trap region 105. The example in FIG. 1A shows tunnel region 107 being a three region tunnel barrier. The three region tunnel barrier can be arranged as a region of dielectric oxide, a region of dielectric nitride disposed on the dielectric oxide, and another region of dielectric oxide disposed on the region of dielectric nitride. Alternatively, tunnel region 107 can be a two region tunnel barrier or a one region tunnel barrier. Further, tunnel region 107 may have more than four regions, where the selection of material and thicknesses depends on the capability of the material with the given thicknesses to perform as a tunneling region to charge trap region 105.

Dielectric blocking region 109 is disposed on and contacting the charge trap region 105. Dielectric blocking region 109 provides a mechanism to block charge from flowing from charge trap region 105 to gate 115. Dielectric blocking region 109 can be an oxide or other dielectric such as used in tunnel region 107. Gate 115 is disposed adjacent to dielectric blocking region 109, but separate from dielectric blocking region 109 by dielectric barrier 110 that is between dielectric blocking region 109 and gate 115, where dielectric barrier 110 comprises a material different from a material of the dielectric blocking region. The material of the dielectric barrier 110 has a dielectric constant greater than that of aluminum oxide.

Dielectric barrier 110 can be structured as being conformal around the edge of gate 115. In the example of FIG. 1A, dielectric barrier 110 is disposed between dielectric blocking region 109 and gate 115 in a vertical manner and along surfaces of gate 115 that are perpendicular to the vertical disposition of dielectric barrier 110 between dielectric blocking region 109 and gate 115. In embodiments having multiple CTs, similar to that shown in FIG. 1A, arranged in a vertical stack, the dielectric barriers 110 of the multiple CTs are discontinuous between each CT along the vertical stack. In an alternative embodiment, the dielectric barrier 110 can be structured between dielectric blocking region 109 and gate 115 in a vertical manner without extending around the edge of gate 115. In a vertical stack of CTs having such vertical dielectric barriers, these dielectric barriers 110 of the multiple CTs can be continuous between each CT along the vertical stack.

A thin $AlO_x$ layer as dielectric barrier 110 between dielectric blocking region 109 and gate 115 enables an enhanced tunneling barrier that prevents the back-tunneling of electrons from gate 115 through dielectric blocking region 109 into charge trap region 105, thereby limiting operational erase saturation to small positive or small negative threshold voltage ($V_t$) levels. (Use of nomenclature $AB_x$ indicates an AB material that is not limited to a particular stoichiometry for the AB compound.) However, the inventor has discovered that better barrier properties can be obtained by replacing this $AlO_x$ layer with a dielectric having a higher dielectric constant, κ, which lead to enhanced erase capability and cycling performance. Aluminum oxide has a κ value of about 9 to 10 and an electron affinity, χ, of about 2.8 eV. The enhanced erase capability and cycling performance can enable structuring a memory device having a memory array of cells, each memory cell structured similar to CT structure 100, as a memory device having quad level cells (QLCs). With $AlO_x$, the usable erase window is still limited, relative to a silicon oxide blocking region, by the erase trap up (shift in threshold voltage) during cycling that happens as the erase $V_t$ moves deeper in the range enabled by the AlOx film. With some materials, such as $HfO_x$, this erase trap up does not occur, thereby expanding the usable program to erase (P/E) window, which provides a key enabler for a QLC with double or possibly single pass programming.

The material of dielectric barrier 110 can have an electron affinity lower than that aluminum oxide. Dielectric barrier 110 can include one or more of hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide. Examples of film that can be used include $HfO_2$ and/or $ZrO_2$ based materials, as well as mixtures with other materials such as $AlO_x$, $SiO_2$, $TiO_2$, $GaO_x$, $NbO_x$, and $Ta_2O_5$. Such materials may not be limited to a particular stoichiometry. Factors in the choice of dielectric barrier may include dielectric material having a reasonably high κ value over 10-15. For example, the material for the dielectric barrier may be selected in a range of 10<κ<80 as a wide range, or a range of 12<κ<40 that is further removed from the range for aluminum oxide and may include a number of candidate materials for the dielectric barrier. Factors in the choice of dielectric barrier may also include dielectric material also having as an electron affinity, χ, lower than 2.8 eV, which is the value for $AlO_x$. For example, the choice of dielectric barrier may include dielectric material also having as a χ value in a range 1.0 eV<χ<2.8 eV or a χ value in a range given by 1.5 eV<χ<2.5 eV, for example.

In various embodiments, a memory device can be structured as a memory structure in which memory cells to store charge are arranged in different levels in three-dimensional (3D) structure. For example, the memory device can include a 3D NAND stack in which memory cells similar to CT structure 100 can be arranged. A NAND array architecture can be arranged as an array of memories (e.g., memory cells) arranged such that the memories of the array are coupled in logical rows to access lines such as word lines. Memories of the array can be coupled together in series between common regions, such as source lines, and data lines such as bit lines.

The 3D NAND stack can be implemented with a dielectric barrier, such as dielectric barrier 110, using materials with better barrier properties in such 3D structures than $AlO_x$, which can provide enhanced improvement in erase saturation relative to $AlO_x$ dielectric barriers in CT structures. The gate, which may be coupled to an access line, for example a word line, or formed as part of the access line, can be formed in a process in which an initially formed region, having material such as silicon nitride, is removed and replaced by a conductive gate in a number of CT cells in a vertical string in the stack. Such gates may be referred to as replacement gates.

Figure 2A:
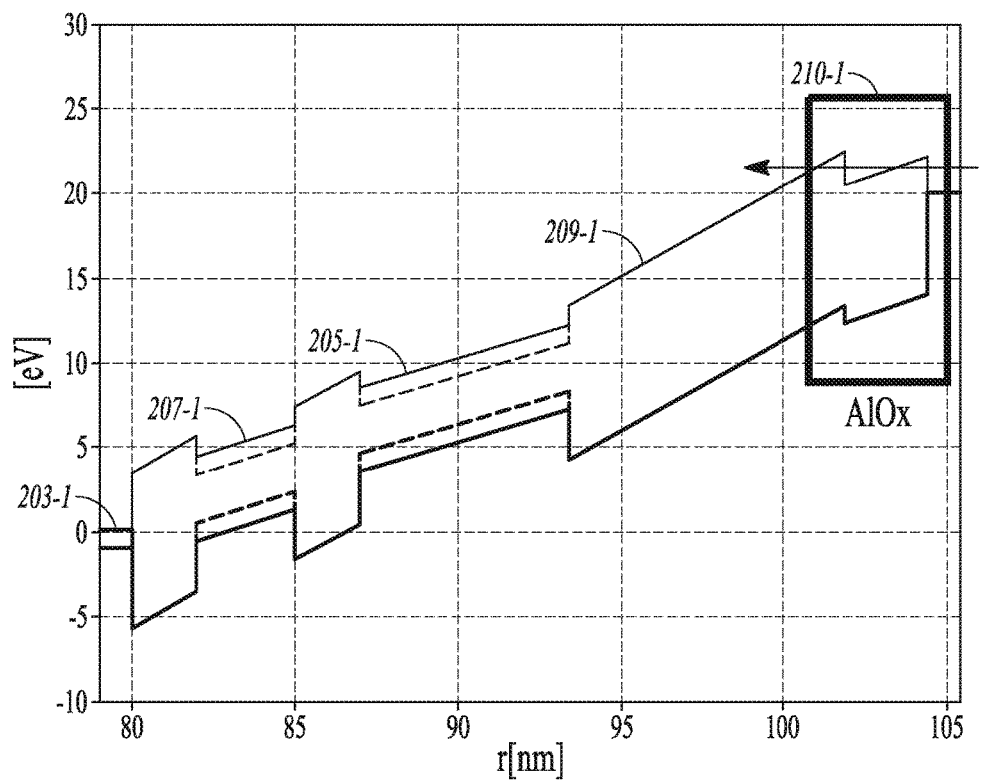
FIGS. 2A-2C illustrate a comparison of a charge trap structure having an aluminum oxide dielectric barrier region with a charge trap structure having a hafnium oxide dielectric barrier region, according to various embodiments.
Figures 2B, 2C:
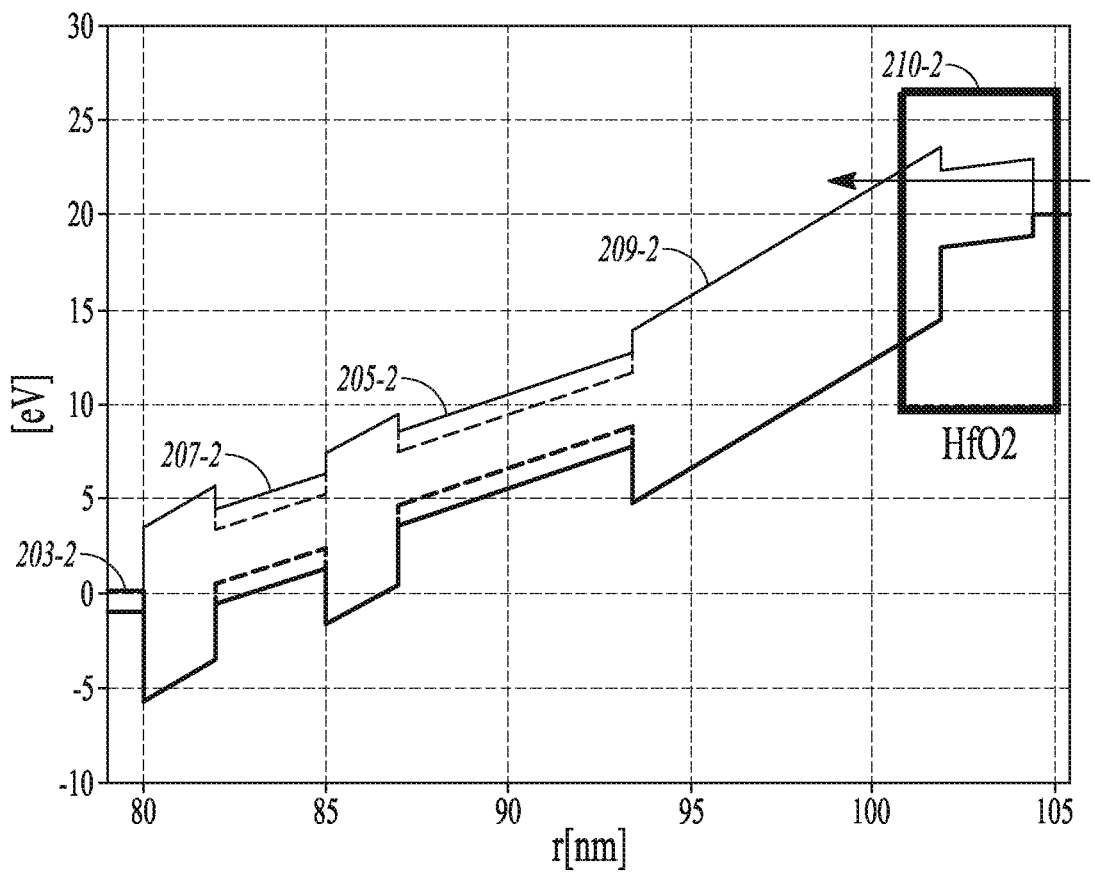

FIGS. 2A-2C illustrate a comparison of a CT structure having an aluminum oxide dielectric barrier region with a CT structure having a hafnium oxide dielectric barrier region, under erase condition of a gate voltage, $V_g$, equal to −20V. FIG. 2A is a band diagram of a CT structure having a silicon region 203-1 separated from a silicon nitride trapping region 205-1 by tunneling silicon oxide region 207-1, where on silicon nitride trapping region 205-1 is a blocking silicon oxide region 209-1 on which is an $AlO_x$ region 210-1. FIG. 2B is a band diagram of a CT structure having a silicon region 203-2 separated from a silicon nitride trapping region 205-2 by tunneling silicon oxide region 207-2, where on silicon nitride trapping region 205-2 is a blocking silicon oxide region 209-2 on which is an $HfO_2$ region 210-2. With the two structures of FIGS. 2A and 2B being the same except for the barrier regions 210-1 and 210-2, it can be seen that the hafnium oxide of barrier region 210-2 provides a better tunneling barrier for electrons during the erase operation, which can lead to a 1V-2V wider P/E window. This enhanced barrier at the gate region of the CT structure may be realized by the higher κ value combined with lower χ of $HfO_2$ compared to $AlO_x$. FIG. 2C is a table of dielectric constants, band gaps, and electron affinities of $SiO_2$ and SiN commonly used with $AlO_x$ in comparison with the properties of $HfO_2$.

A key issue for a memory stack using CT cells includes charge retention in the program and/or erase states. The inventor has determined that $HfO_2$ films, for example, provide matched and better retention for both charge loss and charge gain compared to $AlO_x$, but with a larger P/E window. For standard cycling procedure with respect to programming, essentially there is no difference in trap up between a CT structure with an $AlO_x$ barrier region and a CT structure with a $HfO_2$ barrier region. With respect to erasures, there is a larger P/E window for a CT structure with an $HfO_2$ barrier region than for a CT structure with an $AlO_x$ barrier region.

Figure 3:
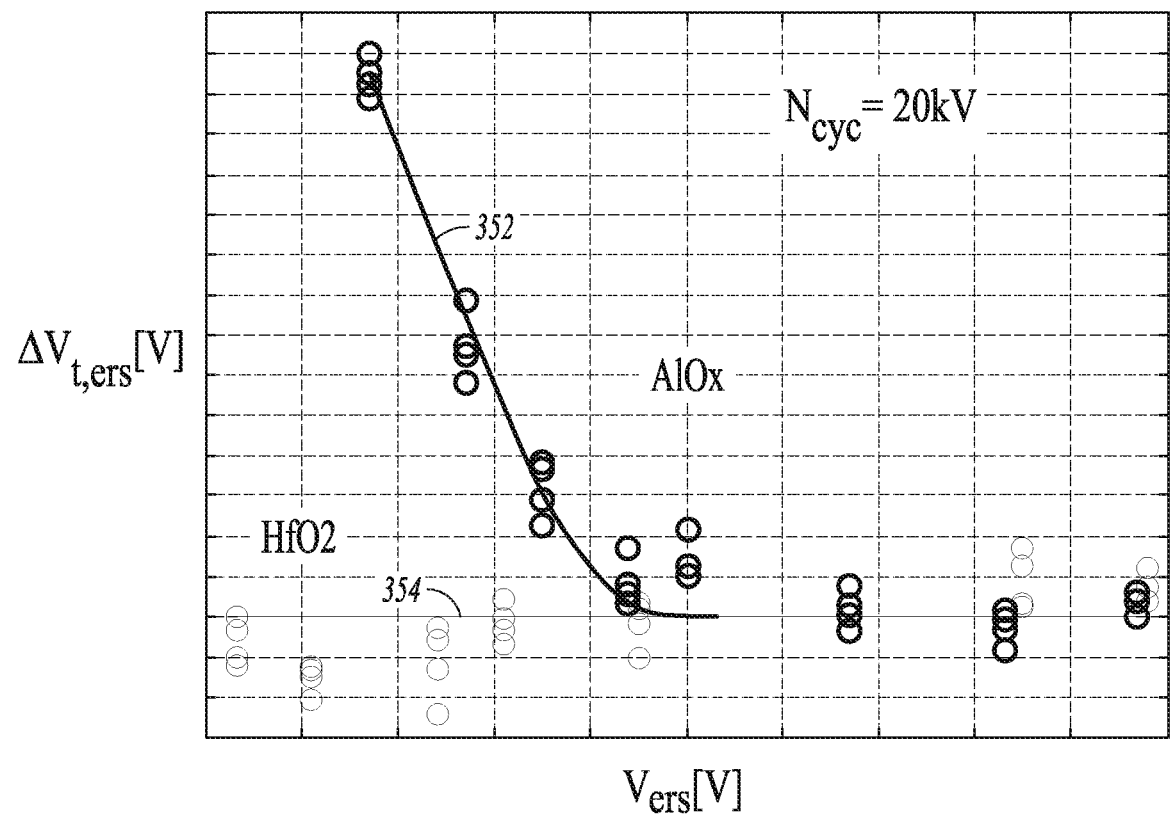
FIG. 3 is plot of cell degradation versus cycling conditions, according to various embodiments.

The inventor has also discovered that an $HfO_2$ barrier region can provide prevention of erase trap up during cycling to low erase $V_t$ states, which restricts the usable P/E window of an $AlO_x$ barrier region. With an $HfO_2$ barrier region, it has been determined that the CT cell can be cycled down to −6V erase and can cycle up to 20k times with reasonable trap up levels, whereas cells with $AlO_x$ have unacceptable trap up at this deep erase level even after just 100 cycles or less. FIG. 3 is plot of cell degradation versus cycling conditions. The number of cycles used was 20k. Curve 352 is a fit for data points for an $AlO_x$ barrier region, while line 354 is an approximate fit for data points for an $HfO_2$ barrier region. $V_{ers}$ is the erase voltage for each of the 20K cycles and $\Delta V_{t,ers}$ is the change in $V_t$ after 20k cycles of program-erase for a given $V_{ers}$. As FIG. 3 shows that use of an $HfO_2$ barrier region enables good cycling to 20K with respect to threshold voltage even at deep erase volts unlike an AlOx barrier region.

Figure 4:
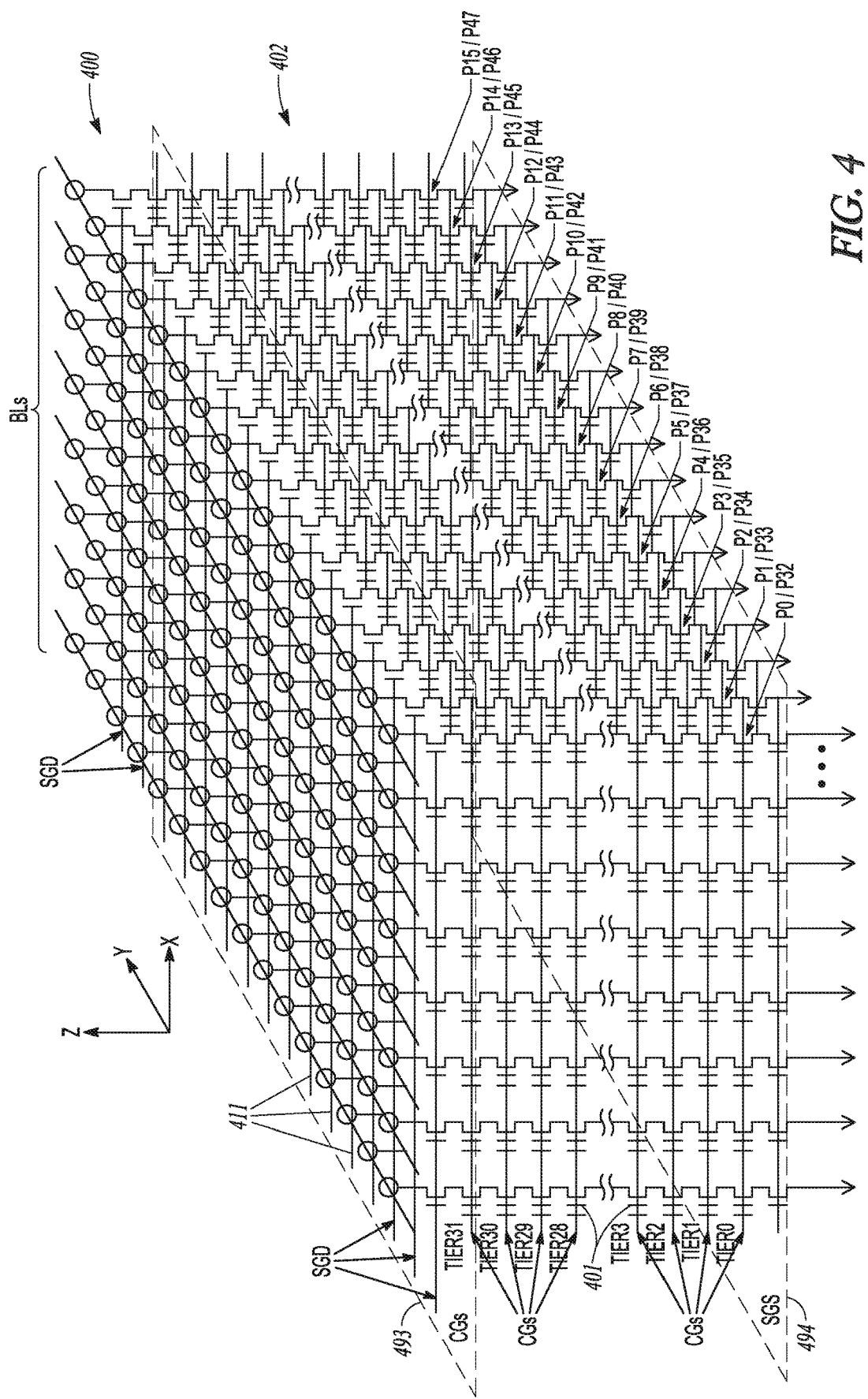
FIG. 4 shows a schematic diagram of a block architecture and page address mapping of a memory array of a three-dimensional memory device, according to various embodiments.

FIG. 4 shows a schematic diagram of a block architecture and page address mapping of a memory array 402 of a 3D memory device 400. Memory device 400 can be realized in the form of a 3D NAND memory device 400. Memory device 400 can comprise multiple vertical strings 411 of charge storage devices 401. In the Z direction shown in FIG. 4, each string 411 of charge storage devices can comprise a multiple storage devices 401 stacked over one another with each charge storage device 401 corresponding to one of multiple tiers. For example, as shown in FIG. 4, thirty-two charge storage devices are stacked over one another in a string with each charge storage device 401 corresponding to one of thirty-two tiers shown as Tier0-Tier31. The number of storage devices and tiers in the Z direction are not limited to thirty-two. The charge storage devices 401 of a respective string 411 may share a common channel region, such as one formed in a respective pillar of semiconductor material (e.g., polysilicon) about which the string of charge storage devices are formed. The pillars may be poly silicon, monocrystalline silicon, or other semiconductor structure in which transistors can be fabricated.

In the X direction shown in FIG. 4, sixteen groups of strings may comprise eight strings that share thirty two access lines, CGs. Each of the access lines CGs may couple (e.g., electrically or otherwise operatively connect) the charge storage devices 401 corresponding to a respective tier of each string 411 of a corresponding one of the eight strings. The charge storage devices 401 coupled by the same access line, CG, (and thus corresponding to the same tier) may be logically grouped into, for example, two pages, such as P0/P32, P1/P33, P2/P34 and so on, when each charge storage device comprise a multi-level cell capable of storing multiple bits of information. Memory device 400 can be arranged to operate each charge storage device as a quad level cell. The page address mapping counts up horizontally in the same Tier.

In the Y direction shown in FIG. 4, eight groups of strings can comprise sixteen strings coupled to a corresponding one of eight data lines (BLs). The structure with respect to the SGSs in this example is one plate 494, which connects 16 pillar strings together, and the structure with respect to the CGs is one plate 493, which connects 16 pillar strings together. The SGD is separated by one pillar string. The number of the strings, tiers, access lines, data lines, groups of strings in each direction, and/or pages may be greater or smaller than those shown in FIG. 4.

The vertical strings 411 can include a vertical semiconductor pillar with a number of charge storage devices 401 arranged along each vertical string. Each charge storage device 401 can include a charge trap region separated from the vertical semiconductor pillar of a respective vertical string by a tunnel region; a dielectric blocking region on the charge trap region; a gate adjacent to the dielectric blocking region to control storage of charge in the charge storage region; and a dielectric barrier between the dielectric blocking region and the gate, material of the dielectric barrier having a dielectric constant greater than that of aluminum oxide, the material of the dielectric barrier different from material of the dielectric blocking region. The gate of each charge storage device 401 can be coupled to or integrated with an access line CG corresponding to the location in memory array 402 of the respective charge storage device 401. Charge storage device 401 may be realized in a manner similar to the CT structure of FIG. 1A or in a manner similar to a CT structure in FIG. 7H.

The components of charge storage device 401 can be implemented by selecting properties from a number of different parameters. The dielectric barrier of charge storage device 401 can include one or more of hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide. The dielectric barrier can have a thickness in a range from about 15 angstroms to about 50 angstroms from the dielectric blocking region to the gate of charge storage device 401. The dielectric barrier of charge storage device 401 can include a dielectric material composition such that the dielectric barrier provides the memory device with a program to erase window that is at least 0.5 volts wider than the memory device having the dielectric barrier composed of aluminum oxide.

The tunnel region of charge storage device 401 can be implemented as a three region tunnel barrier. Such a three region tunnel barrier can be implemented as a region of dielectric oxide, a region of dielectric nitride disposed on the dielectric oxide, and another region of dielectric oxide disposed on the region of dielectric nitride. The tunnel region of charge storage device 401 can be implemented as a two region tunnel barrier. The tunnel region of charge storage device 401 can be implemented as a one region tunnel barrier. Further, the tunnel region tunnel region of charge storage device 401 may have four or more regions, where the selection of material and thicknesses depends on the capability of the material with the given thicknesses to perform as a tunneling region to the charge trap region of charge storage device 401. The gate of charge storage device 401 can be implemented as a metal gate. The channel of charge storage device 401 in a string 411 can be implemented as a poly silicon channel.

Implementation of a high-K film, having a dielectric constant greater than that of $AlO_x$, as a barrier region between a gate and a dielectric blocking region of a CT structure can be integrated onto a 3D NAND structure in a 3D replacement gate (RG) flow in the manner in which a $AlO_x$ is conventionally formed. For example, the high-κ film can be deposited in a 3D structure after a wet nitride strip and just before a metal replacement gate stack is deposited. Thermal budget requirements are much less for the 3D RG flow, which only requires a short re-activation anneal in the case of high-κ flow, than for planar floating gate NAND generations.

Another option is to deposit the high-κ film directly into a pillar-like formation before a blocking oxide deposition is conducted. In processing, the pillar-like formation can begin with a trench in which a string of CTs can be formed. In this case, the film would have to be able to withstand the hot phosphorous or other nitride removal process during the gate replacement processing module. However, in this option, the high-k material would not have to withstand the metal recess processing associated with conventional RG processing in a 3D NAND structure, either dry etch, wet etch, or combination. In fabricating CT cells in this option for a 3D NAND structure, a doped hollow channel (DHC) can be formed and the critical dimensions would likely need to be enlarged to accommodate more films inside the pillar and maintain sufficient margin for a punch etch to connect the DHC to a source. In this option, the integration flow would have higher thermal stability requirements than for planar floating gate NAND generations.

Figure 5:
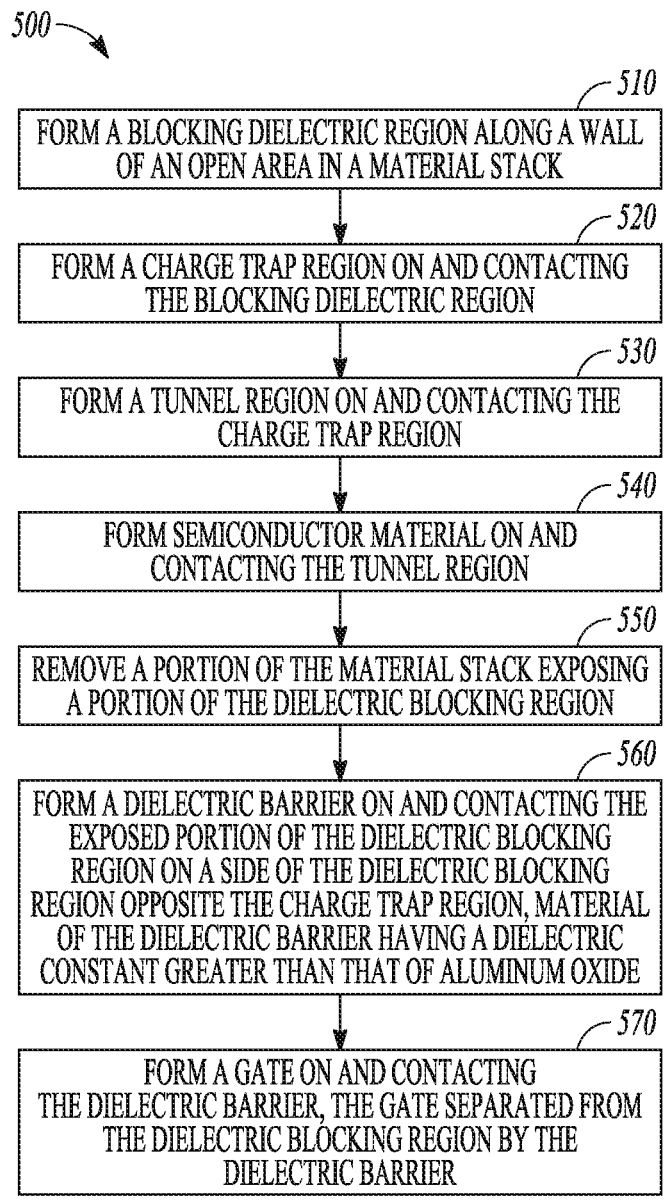
FIG. 5 is a flow diagram of features of an example method of forming charge trap structures, according to various embodiments.

FIG. 5 is a flow diagram of features of an embodiment of an example method 500 of forming a CT structure. At 510, a blocking dielectric region is formed along a wall of an open area in a material stack. At 520, a charge trap region is formed on and contacting the blocking dielectric region. At 530, a tunnel region is formed on and contacting the charge trap region. At 540, semiconductor material is formed on and contacting the tunnel region. The semiconductor pillar can be structured as a channel operable to conduct a current.

At 550, a portion of the material stack is removed, exposing a portion of the dielectric blocking region. In a process of forming a number of CTs along a common direction, the material stack may be sufficiently large in which to form the CTs and removal of portions of the material stack can include forming slits between CTs being formed before exposing portions of dielectric blocking regions. At 560, a dielectric barrier is formed on and contacting the exposed portion of the dielectric blocking region on a side of the dielectric blocking region opposite the charge trap region. Material of the dielectric barrier can have a dielectric constant greater than that of aluminum oxide. The material of the dielectric barrier is different from the material of the dielectric blocking region. Forming the dielectric barrier can include depositing one or more of hafnium oxide, zirconium oxide, or a mixture of hafnium oxide and/or zirconium oxide with one or more of aluminum oxide, silicon oxide, titanium oxide, gadolinium oxide, niobium oxide, or tantalum oxide.

At 570, a gate is formed on and contacting the dielectric barrier, the gate separated from the dielectric blocking region by the dielectric barrier. The gate is formed as arranged to control storage of charge in the charge storage region. The formed blocking dielectric region, the formed charge trap region, the formed tunnel region, the formed semiconductor pillar, the formed dielectric barrier, and the formed gate form a charge trap structure. Forming the gate can include forming a conductive titanium nitride region on and contacting the dielectric barrier, and forming tungsten on and contacting the conductive titanium nitride. The conductive titanium nitride region can be formed as an adhesive region. Features of method 500 can be formed in a number of different sequencing steps and is not limited to the order or features as presented in FIG. 5.

Variations of method 500 or methods similar to method 500 can include a number of different embodiments that may or may not be combined depending on the application of such methods and/or the architecture of devices or systems in which such methods are implemented. Such methods can include, forming additional charge trap structures in a vertical stack in the material stack with the charge trap structure, where the vertical stack has multiple levels with one charge trap structure of the charge trap structures on each level of the vertical stack. Forming the charge trap structure and the additional charge trap structures can include forming the charge trap structure and the additional charge trap structures such that the dielectric barriers of the charge trap structures in the vertical stack are discontinuous along the vertical stack. The semiconductor pillar, having a number of the charge trap structures, can be coupled to a semiconductor region formed as a source region.

Figure 6:
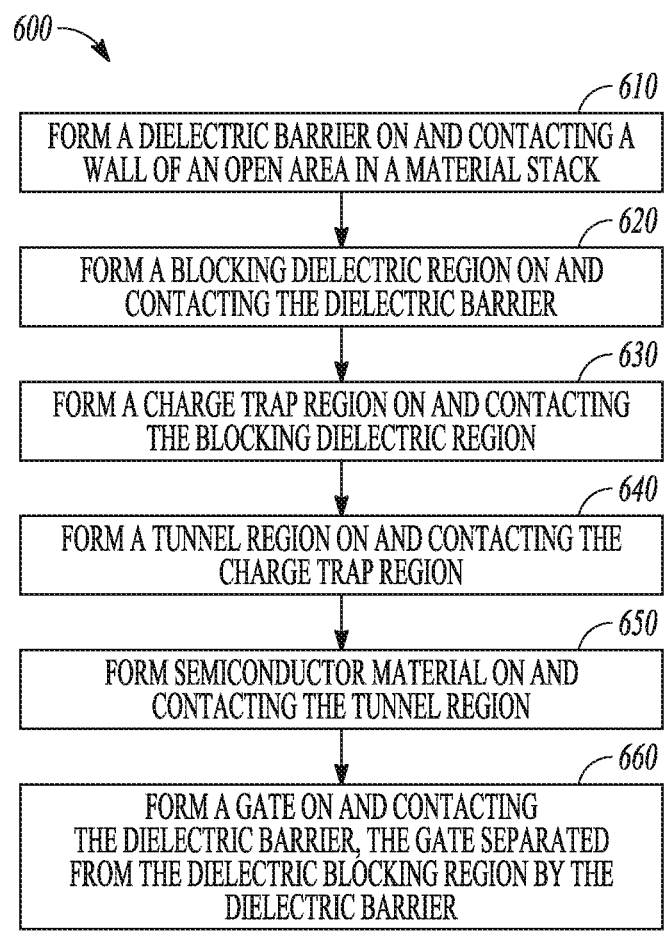
FIG. 6 is a flow diagram of features of an example method of forming charge trap structures, according to various embodiments.

FIG. 6 is a flow diagram of features of an embodiment of an example method 600 of forming a CT structure. At 610, a dielectric barrier is formed on and contacting a wall of an open area in a material stack. Forming the dielectric barrier can include forming aluminum oxide. Forming the dielectric barrier can include depositing one or more of hafnium oxide, zirconium oxide, of a mixture of hafnium oxide and/or zirconium oxide with one or more of aluminum oxide, silicon oxide, titanium oxide, gadolinium oxide, niobium oxide, or tantalum oxide.

At 620, a blocking dielectric region is formed on and contacting the dielectric barrier. The material of the dielectric barrier is different from the material of the dielectric blocking region. The material of the dielectric barrier can have a dielectric constant greater than that of aluminum oxide. At 630, a charge trap region is formed on and contacting the blocking dielectric region. At 640, a tunnel region is formed on and contacting the charge trap region. At 650, semiconductor material is formed on and contacting the tunnel region. The semiconductor material is structured to be operable to conduct a current.

At 660, a gate is formed on and contacting the dielectric barrier, the gate separated from the dielectric blocking region by the dielectric barrier. Forming the gate can include forming the gate arranged to control storage of charge in the charge storage region. Forming the gate can include forming a conductive titanium nitride region on and contacting the dielectric barrier. In one variation, forming the gate can include forming tungsten on and contacting the conductive titanium nitride. The formed blocking dielectric region, the formed charge trap region, the formed tunnel region, the formed semiconductor material, the formed dielectric barrier, and the formed gate form a charge trap structure. Features of method 600 can be formed in a number of different sequencing steps and is not limited to the order or features as presented in FIG. 6.

Variations of method 600 or methods similar to method 600 can include a number of different embodiments that may or may not be combined depending on the application of such methods and/or the architecture of devices or systems in which such methods are implemented. Such methods can include forming the material stack on a semiconductor region including forming the open area as an open pillar in the material stack, the material stack including alternating isolation dielectrics and sacrificial regions for conductive regions; removing portions of the sacrificial regions, exposing portions of the dielectric barrier; and forming multiple gates on and contacting the exposed portions of the dielectric barrier such that additional charge trap structures are formed in the material stack. The vertical stack can have multiple levels with one charge trap structure of the charge trap structures on each level of the vertical stack, where each gate of a charge trap structure is separated from a gate of an adjacent charge trap structure in the vertical stack by one of the isolation dielectrics. Forming the charge trap structures can include forming the dielectric barrier, the blocking dielectric region, the charge trap region, the tunnel region, and the semiconductor material as continuous regions between and through the charge trap structures. Such methods can include forming the semiconductor material to include forming a doped hollow pillar of the semiconductor material in the open pillar. The semiconductor region can be formed as a poly silicon source region.

Figure 7A:
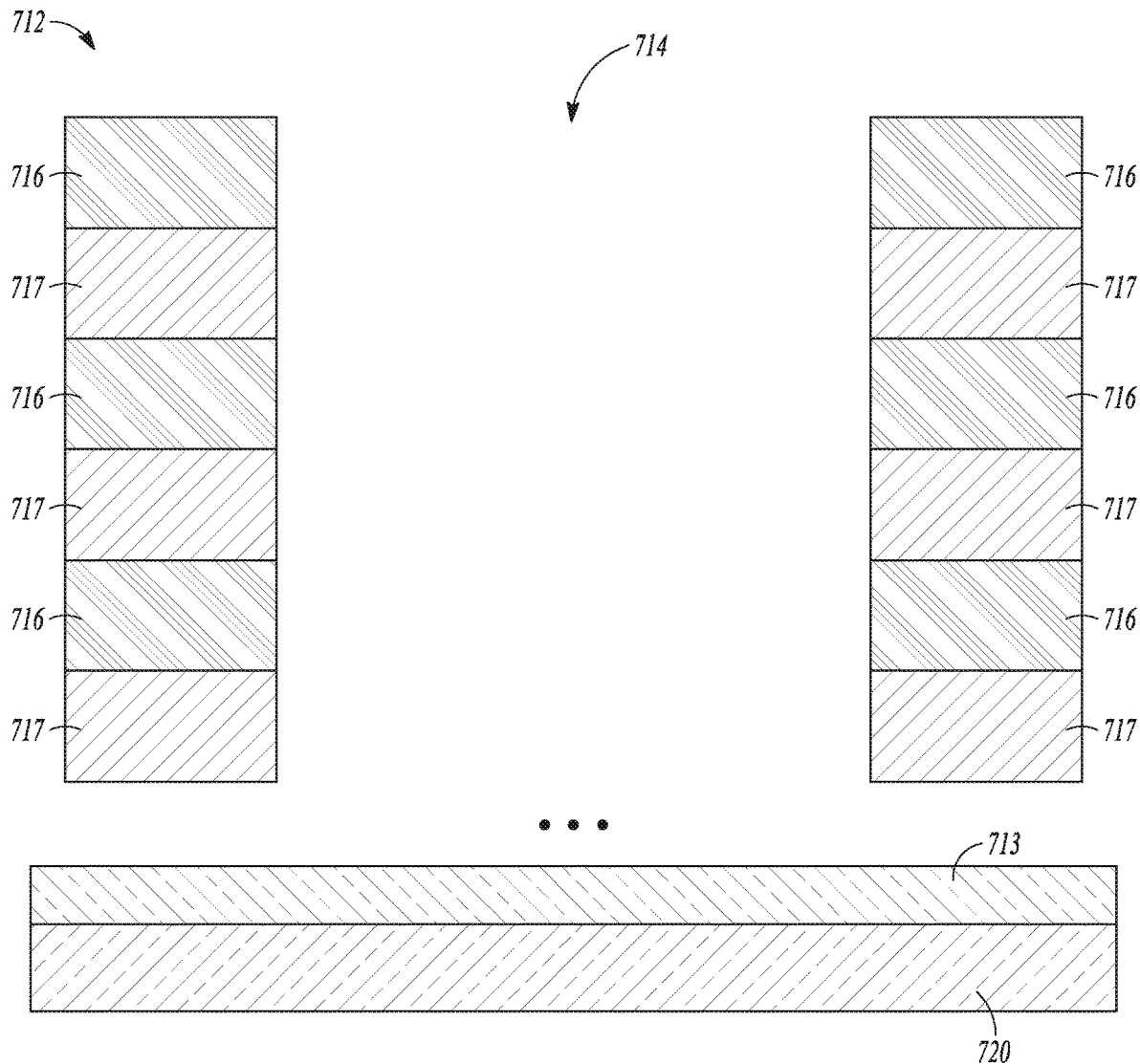
FIGS. 7A-7H illustrate stages of an example method to form charge trap structures in a vertical stack, according to various embodiments.

FIGS. 7A-7H illustrate stages of an embodiment of an example method to form charge trap structures in a vertical stack, where the figures are cross-sectional views. FIG. 7A shows a material stack 712 above a conductive region 713 with an open pillar 714 in material stack 712, where the material stack 712 includes alternating isolation dielectrics 717 and sacrificial regions 716. The number of alternating isolation dielectrics 717 and sacrificial regions 716 depends on the number of CT structures being formed in a vertical stack. In a 3D memory device, this number can depend on the number of tiers in the memory array of the memory device, for example, a pair of a combination of isolation dielectric 717 and sacrificial region 716 for each tier. Three isolation dielectrics 717 and three sacrificial regions 716 are shown in FIG. 7A for ease of discussion. Isolation dielectrics 717 can include, but are not limited to, an oxide such as silicon oxide, and sacrificial regions 716 can include but are not limited to, a nitride such as silicon nitride. The choice of material for isolation dielectrics 717 and sacrificial regions 716 can depend on the temperatures and chemistries used in fabricating multiple CT structures. Conductive region 713 can be a semiconductor region 713 such as, but not limited to, a semiconductor region formed including poly silicon. In FIGS. 7A-7H, a space is shown between a region 717 and conductive region 713 on a substrate 720 to indicate that there may be additional materials and/or integrated circuit structures between region 717 and conductive region 713, where these additional materials and/or integrated circuit structures may include region 717.

Figure 7B:
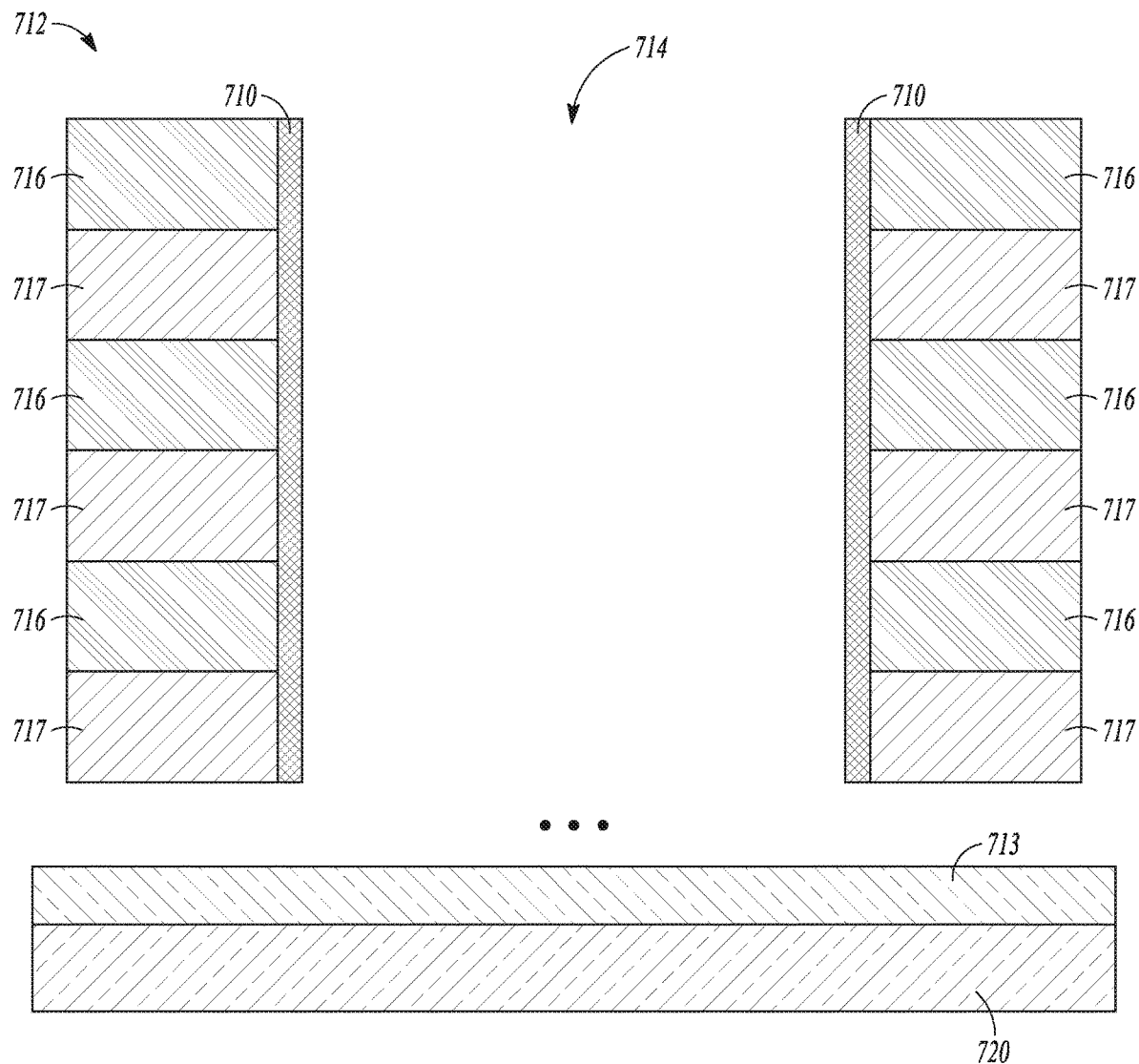

FIG. 7B shows a dielectric barrier 710 formed on a wall of the open pillar 714 in material stack 712. Forming the dielectric barrier 710 can include depositing one or more of aluminum oxide, hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide, Dielectric barrier 710 can be formed with a thickness from the wall of the open pillar 714 in the range of 15 to 50 angstroms. The deposition can be performed using one of a number of deposition processes. For example, the deposition can be implemented using chemical vapor deposition (CVD) or atomic layer deposition (ALD). ALD allows formation of a deposited region as a nanolaminate of a number of different compounds in each of a sub-region of the deposited region with the deposited region having a total thickness in the nanometer region. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 5 nanometers.

Figure 7C:
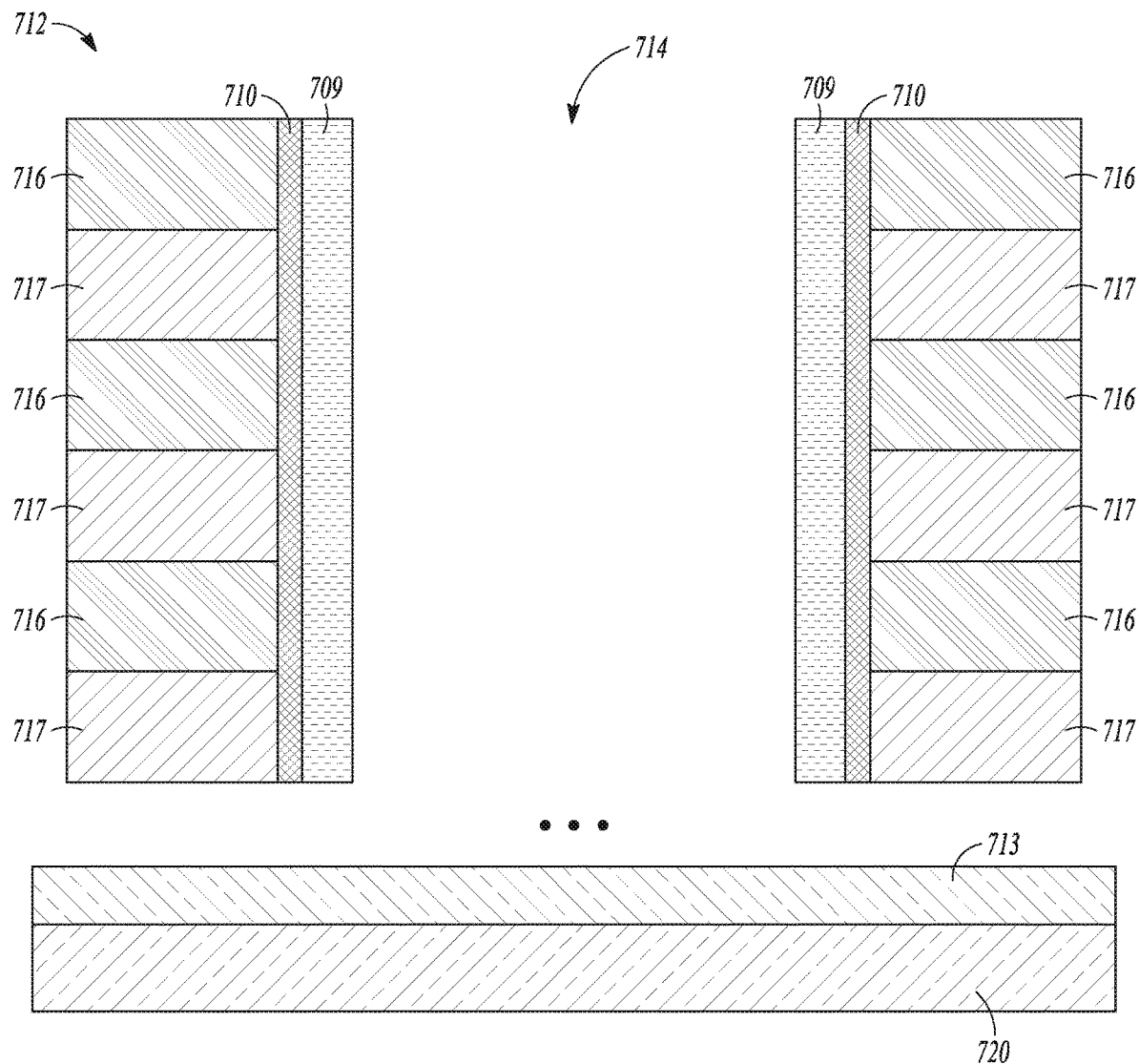
Figure 7D:
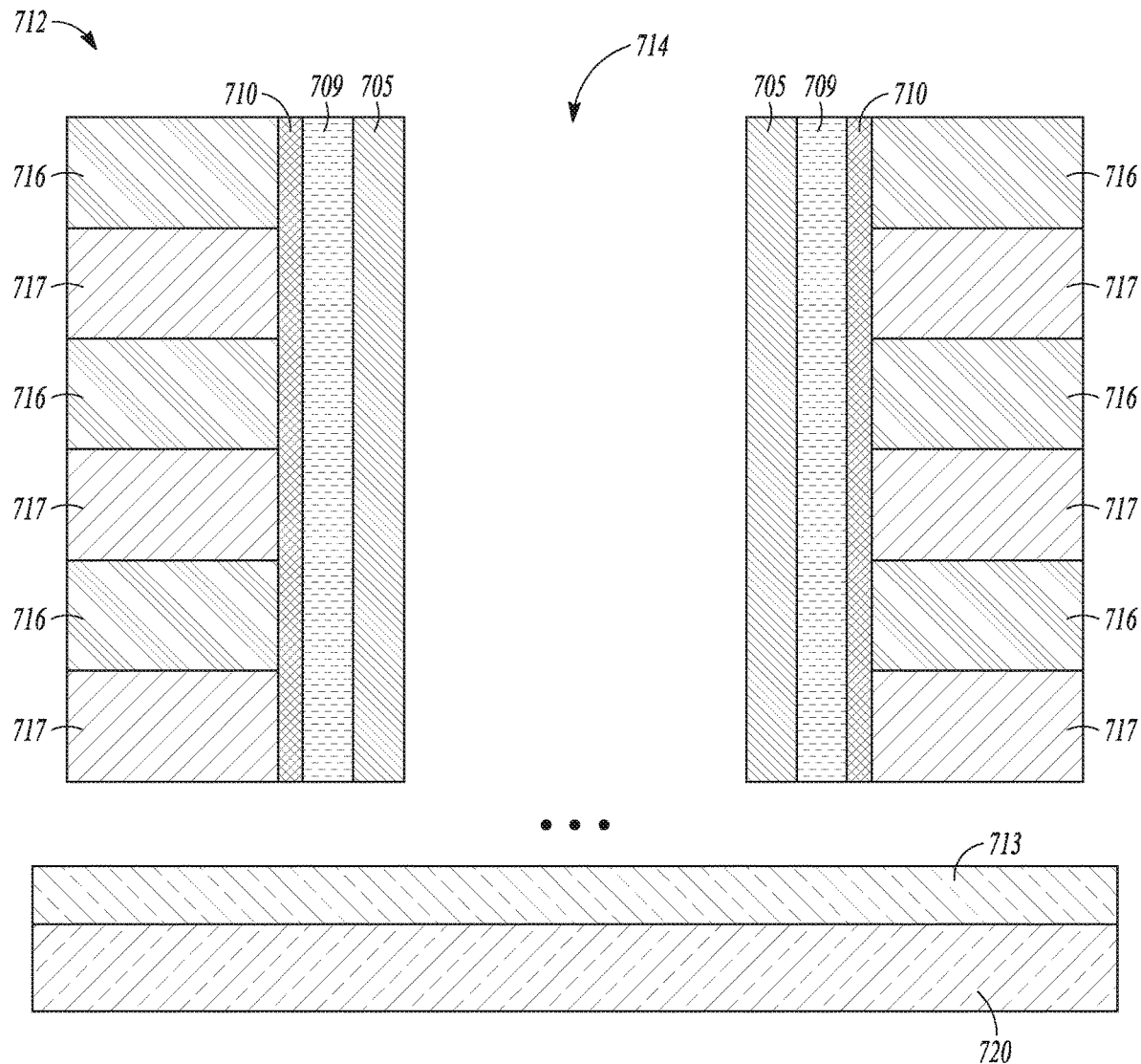
Figure 7E:
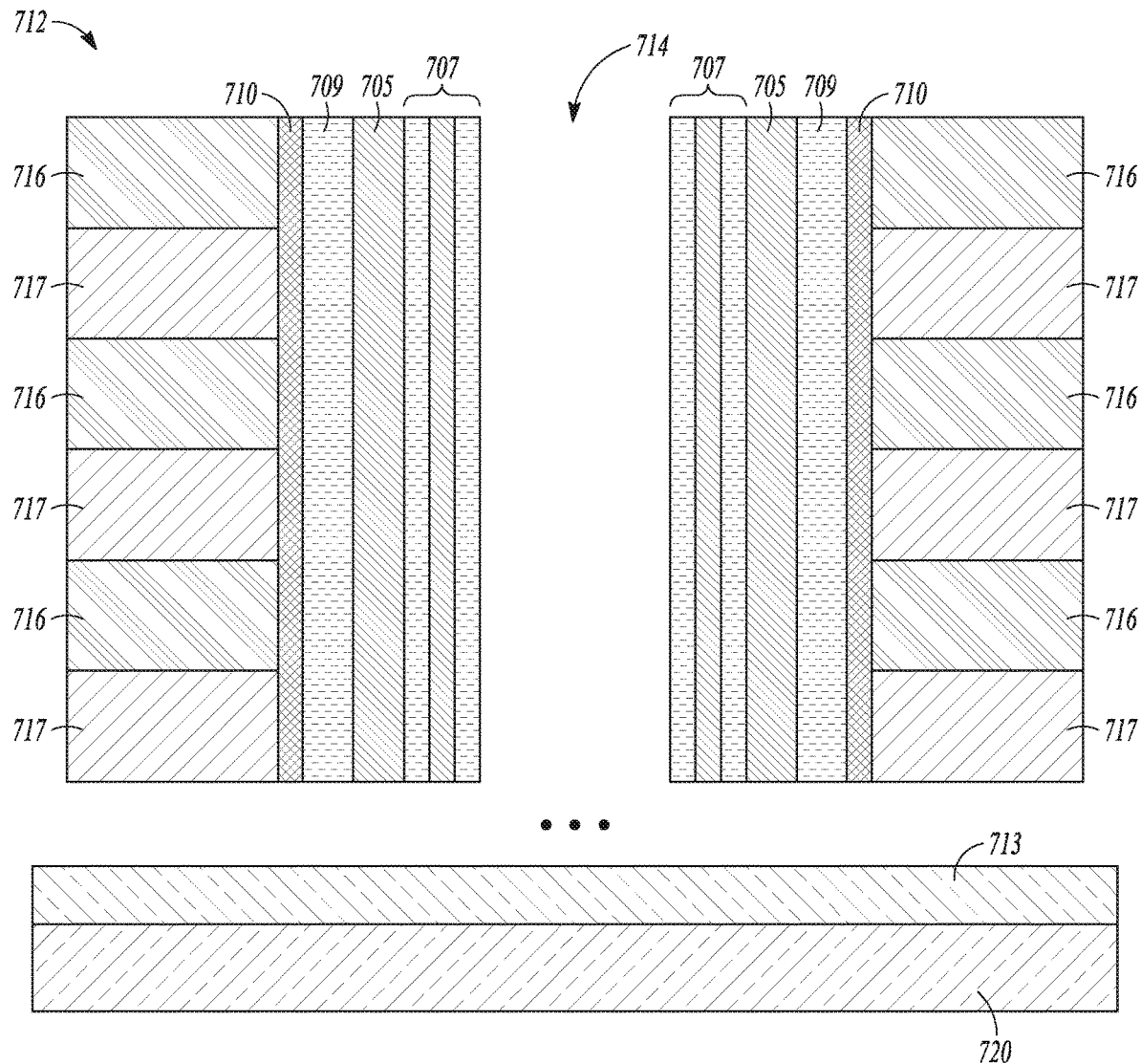

FIG. 7C shows a dielectric blocking region 709 formed on a surface of the dielectric barrier 710 opposite the wall of the open pillar 714. Dielectric blocking region 709 can include silicon oxide or other dielectric material. FIG. 7D shows material for a charge trap region 705 formed on a surface of the dielectric blocking region 709 opposite the surface of the dielectric barrier 710. Charge trap region 705 can include a dielectric nitride or other charge-trapping dielectric material. FIG. 7E shows material for a tunnel region 707 formed on the charge trap region 705. Tunnel region 707 can be implemented as a three region tunnel barrier as shown in FIG. 7E. Such a three region tunnel harrier can be implemented as a region of dielectric oxide followed by a region of dielectric nitride followed by another region of dielectric oxide. Tunnel region 707 can be implemented as a two region tunnel barrier. Tunnel region 707 can be implemented as a one region tunnel barrier. Further, tunnel region 707 may have four or more regions, where the selection of material and thicknesses depends on the capability of the material with the given thicknesses to perform as a tunneling region to the charge trap region 705. Tunnel region 707 can include one or more dielectrics such as silicon oxide or dielectrics having a dielectric constant greater than that of silicon dioxide.

Figure 7F:
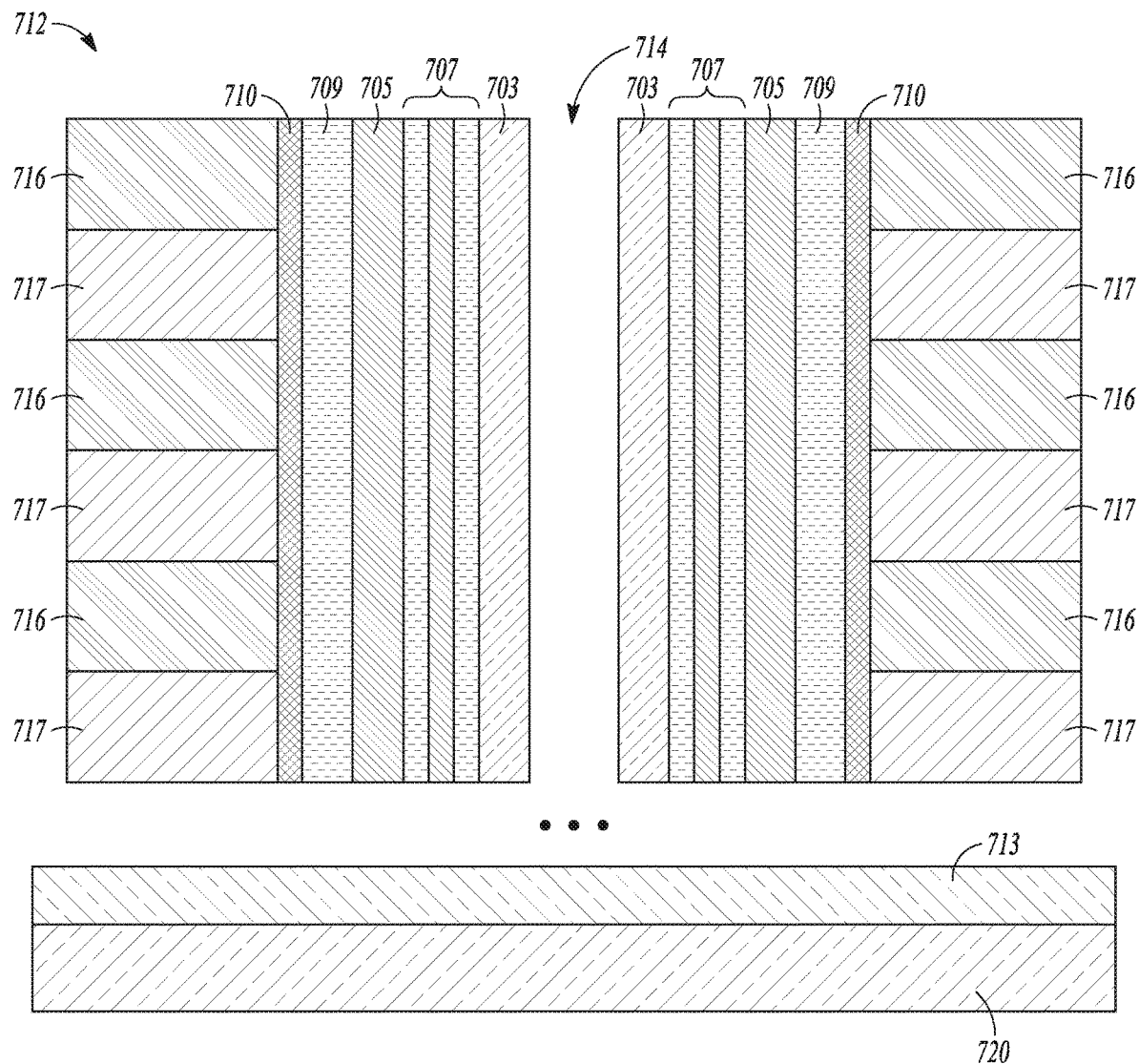

FIG. 7F shows a semiconductor pillar 703 formed on and contacting tunnel region 707. Semiconductor pillar 703 can be formed as a doped hollow channel on the material for the tunnel region 707. The doped hollow channel can be coupled to conductive region 713. However, the manner in which semiconductor pillar 703 is coupled to conductive region 713 may depend on the structures in the region between the lowest isolation dielectric 717 and conductive region 713. This region may contain one or more access transistors coupled to the vertical stack of CTs, where the access transistors are not structured as charge storage cells. These one or more access transistors may be structured to share semiconductor pillar 703 as its transistor channel. In such cases, before semiconductor pillar 703 is deposited to make contact to conductive region 713, dielectrics, which are on the sidewalls of open pillar 714, are also formed on conductive region 713 in the middle regions of open pillar 714. The dielectrics formed on conductive region 713 in the middle regions of open pillar 714 can be etched to remove the dielectrics from conductive region 713 in the middle regions of open pillar 714 without removing the dielectrics on the sidewalls of open pillar 714. This type of etch is referred to as a "punch". After the etch, the material for semiconductor pillar 703 can be formed on tunnel region 707 and on and contacting conductive region 713. Conductive region 713 can be a semiconductor region 713 formed as a source region.

Figure 7G:
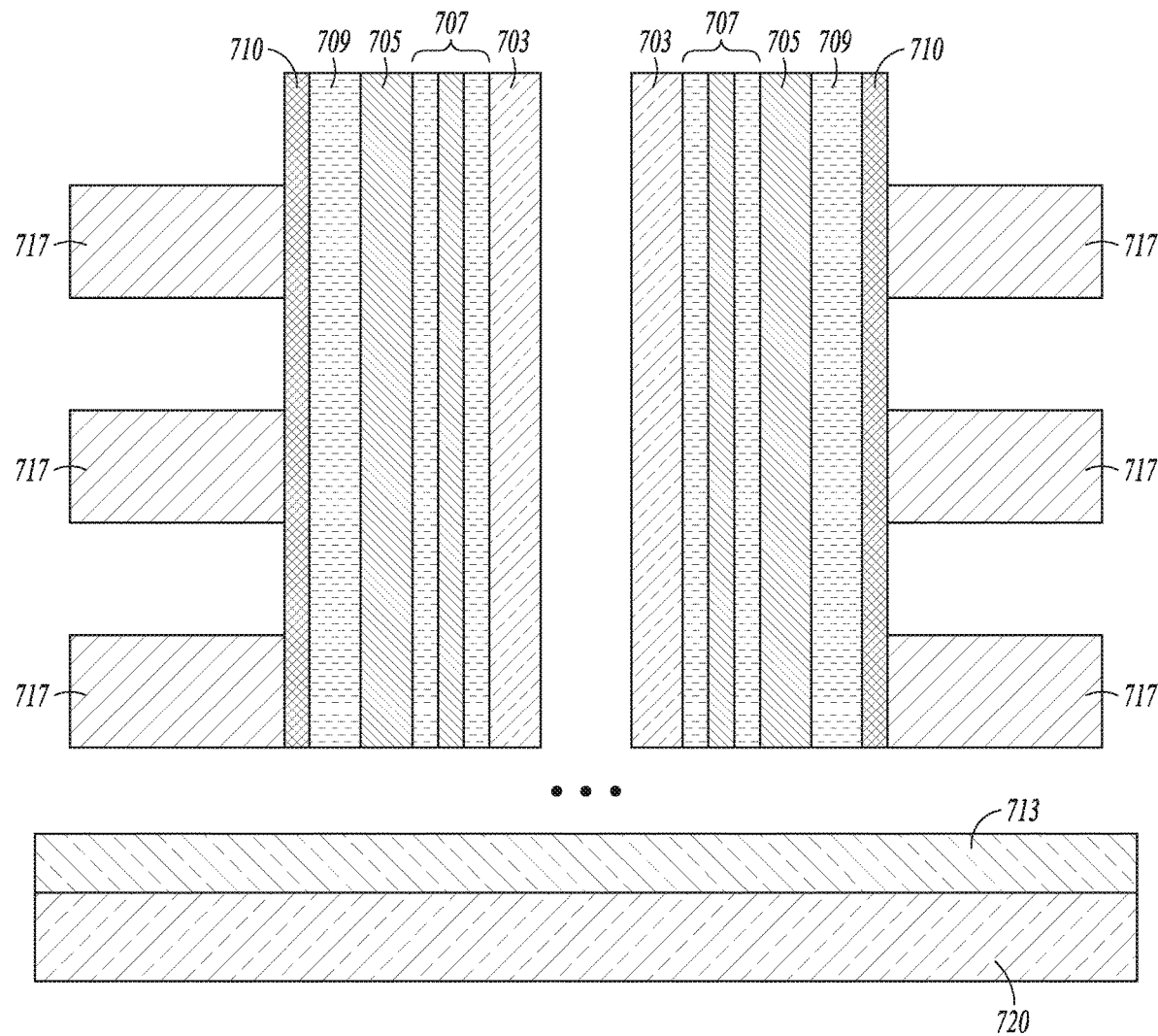
Figure 7H:
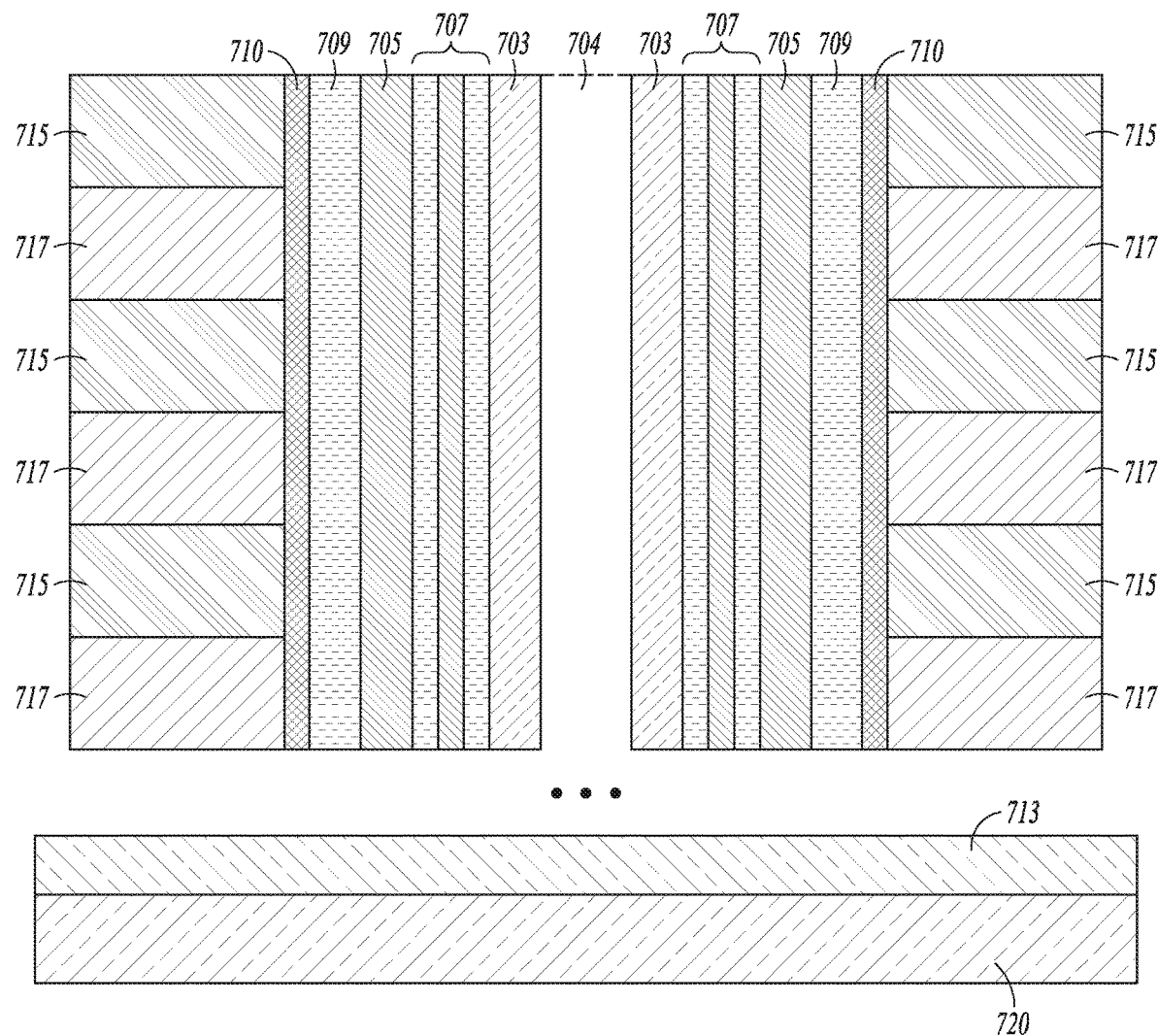

FIG. 7G shows the structure of FIG. 7F with portions of the sacrificial regions 716 removed, leaving open regions (air) between isolation dielectrics 717. FIG. 7H shows material for gates 715 formed in the open regions of the structure of FIG. 7G. The material for gates 715 are conductive regions replacing the sacrificial regions 716 of FIG. 7A. The conductive material for gates 715 can include one or more metals. For example, the conductive material for gates 715 can include conductive titanium nitride on which tungsten is deposited. Other metals and/or combinations of metals and metallic compounds can be used. FIG. 7H shows a dielectric material in center region 704, which is a remainder of open pillar 714 after forming regions in open pillar 714. The dielectric material in center region may include silicon oxide.

Figure 8:
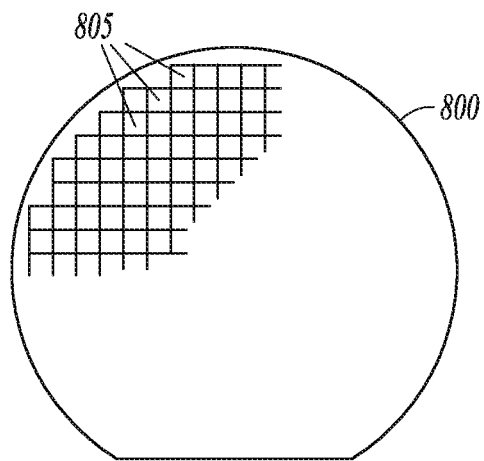
FIG. 8 illustrates an example of a wafer having multiple electronic components, according to various embodiments.

FIG. 8 illustrates an embodiment of an example of a wafer 800 having multiple electronic components. Wafer 800 can be provided as a wafer in which a number of dice 805 can be fabricated. Alternatively, wafer 800 can be provided as a wafer in which the number of dice 805 have been processed to provide electronic functionality and are awaiting singulation from wafer 800 for packaging. Wafer 800 can be provided as a semiconductor wafer, a semiconductor on insulator wafer, or other appropriate wafer for processing electronic devices such as an integrated circuit chips. Wafer 800 can be fabricated in accordance with any embodiment related to FIGS. 1-7.

Using various masking and processing techniques, each die 805 can be processed to include functional circuitry such that each die 805 is fabricated as an integrated circuit with the same functionality and packaged structure as the other dice on wafer 800. Alternatively, using various masking and processing techniques, various sets of dice 805 can be processed to include functional circuitry such that not all of the dice 805 are fabricated as an integrated circuit with the same functionality and packaged structure as the other dice on wafer 800. A packaged die having circuits integrated thereon providing electronic capabilities is herein referred to as an integrated circuit (IC).

Wafer 800 can comprise multiple dice 805. Each die 805 of the multiple dice can include a number of vertical strings, where each vertical string includes a vertical semiconductor pillar operable to conduct a current. A number of charge storage devices can be arranged along each vertical string, where each charge storage device includes a charge trap region separated from the vertical semiconductor pillar of the respective vertical string by a tunnel region; a dielectric blocking region on the charge trap region; a gate adjacent to the dielectric blocking region to control storage of charge in the charge storage region, the gate coupled to an access line; and a dielectric barrier between the dielectric blocking region and the gate, material of the dielectric barrier being different from material of the dielectric blocking region. The dielectric barrier can include aluminum oxide vertically structured without extending around the edge of the gate or a dielectric having a dielectric constant greater than that of aluminum oxide. The charge storage devices can be arranged in accordance with the teachings for a CT structure as taught herein. For example, the dielectric barrier of the charge storage devices of dies 805 can include one or more of aluminum oxide, hafnium oxide, zirconium oxide, and mixtures of hafnium oxide and/or zirconium oxide with one or more of aluminum oxide, silicon oxide, titanium oxide, gadolinium oxide, niobium oxide, or tantalum oxide. In addition, the dielectric barrier can have a dielectric constant greater than or equal to twelve. The charge trap region of the charge storage devices of dies 805 can be implemented as a dielectric nitride region and the tunnel region can include a set of dielectric regions.

Figure 9:
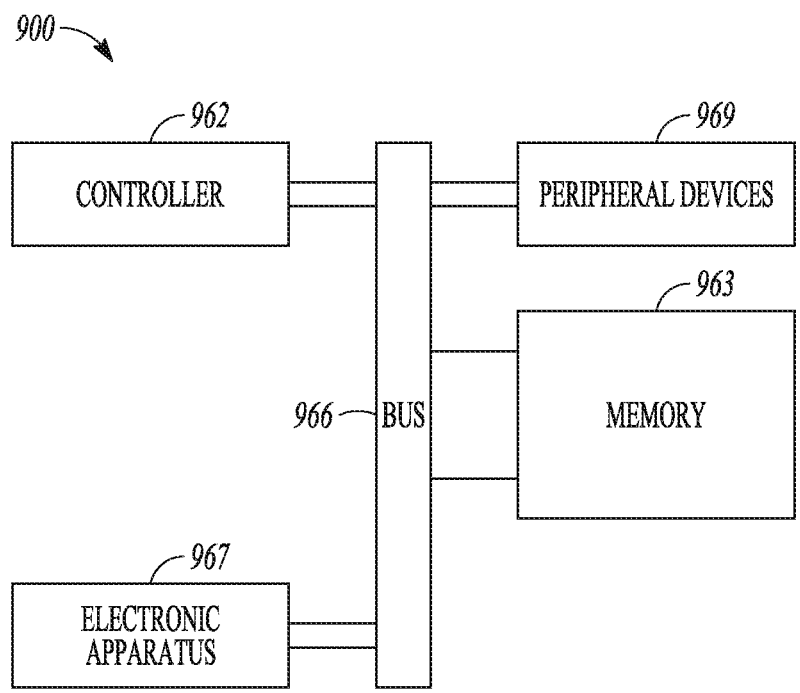
FIG. 9 shows a block diagram of an example system that includes a memory structured with an array of charge trap structures as memory cells, according to various embodiments.

FIG. 9 shows a block diagram of an embodiment of an example system 900 that includes a memory 963 structured with an array of CT structures as memory cells. The architectures of the CT structures and the memory can be realized in a manner similar to or identical to structures in accordance with various embodiments discussed herein. System 900 can include a controller 962 operatively coupled to memory 963. System 900 can also include an electronic apparatus 967 and peripheral devices 969. One or more of controller 962, memory 963, electronic apparatus 967, and peripheral devices 969 can be in the form of one or more ICs.

A bus 966 provides electrical conductivity between and/or among various components of system 900. In an embodiment, bus 966 includes an address bus, a data bus, and a control bus, each independently configured. In an alternative embodiment, bus 966 uses common conductive lines for providing one or more of address, data, or control, the use of which is regulated by controller 962. Controller 962 can be in the form or one or more processors.

Electronic apparatus 967 may include additional memory. Memory in system 900 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 969 may include displays, imaging devices, printing devices, wireless devices, additional storage memory, and control devices that may operate in conjunction with controller 962. In various embodiments, system 900 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method comprising:
   forming a blocking dielectric region along a wall of an open area in a material stack;
   forming a charge trap region on and contacting the blocking dielectric region;
   forming a tunnel region on and contacting the charge trap region;
   forming semiconductor material on and contacting the tunnel region, the semiconductor material operable as a channel structure to conduct a current;
   removing a portion of the material stack exposing a portion of the dielectric blocking region;
   forming a dielectric barrier on and contacting the exposed portion of the dielectric blocking region on a side of the dielectric blocking region opposite the charge trap region, a material of the dielectric barrier being different from a material of the dielectric blocking region, the material of the dielectric barrier having a dielectric constant greater than that of aluminum oxide; and
   forming a gate on and contacting the dielectric barrier, the gate separated from the dielectric blocking region by the dielectric barrier.

2. The method of claim 1, wherein forming the dielectric barrier includes depositing hafnium oxide.

3. The method of claim 1, wherein forming the dielectric barrier includes depositing zirconium oxide.

4. The method of claim 1, wherein forming the dielectric barrier includes depositing a mixture of hafnium oxide with aluminum oxide.

5. The method of claim 1, wherein forming the dielectric barrier includes depositing a mixture of zirconium oxide with aluminum oxide.

6. The method of claim 1, wherein forming the dielectric barrier includes depositing a mixture of hafnium oxide with one or more of silicon oxide, titanium oxide, gadolinium oxide, niobium oxide, or tantalum oxide.

7. The method of claim 1, wherein forming the dielectric barrier includes depositing a mixture of zirconium oxide with one or more of silicon oxide, titanium oxide, gadolinium oxide, niobium oxide, or tantalum oxide.

8. The method of claim 1, wherein forming the gate includes forming a conductive titanium nitride region on and contacting the dielectric barrier and forming tungsten on and contacting the conductive titanium nitride.

9. A method comprising:
  forming a dielectric barrier on and contacting a wall of an open area in a material stack, with the dielectric barrier structured as a nanolaminate having at least three different material layers with the nanolaminate having a dielectric constant greater than that of aluminum oxide;
  forming a blocking dielectric region on and contacting the dielectric barrier, a material of the dielectric barrier being different from a material of the dielectric blocking region;
  forming a charge trap region on and contacting the blocking dielectric region;
  forming a tunnel region on and contacting the charge trap region;
  forming semiconductor material on and contacting the tunnel region, the semiconductor material operable as a channel structure to conduct a current; and
  forming a gate on and contacting the dielectric barrier, the gate separated from the dielectric blocking region by the dielectric barrier.

10. The method of claim 9, wherein the material of the dielectric barrier has a dielectric constant greater than that of aluminum oxide.

11. The method of claim 9, wherein forming the dielectric barrier includes depositing aluminum oxide.

12. The method of claim 9, wherein forming the dielectric barrier includes depositing hafnium oxide.

13. The method of claim 9, wherein forming the dielectric barrier includes depositing zirconium oxide.

14. The method of claim 9, wherein forming the dielectric barrier includes depositing a mixture of hafnium oxide with one or more of aluminum oxide, silicon oxide, titanium oxide, gadolinium oxide, niobium oxide, or tantalum oxide.

15. The method of claim 9, wherein forming the dielectric barrier includes depositing a mixture of zirconium oxide with one or more of aluminum oxide, silicon oxide, titanium oxide, gadolinium oxide, niobium oxide, or tantalum, oxide.

16. The method of claim 9, wherein forming the dielectric barrier includes forming material of the dielectric barrier having a dielectric constant ($\kappa$) in a range of $12<\kappa<40$.

17. The method of claim 9, wherein forming the dielectric barrier includes forming material of the dielectric barrier having an electron affinity in a range of $1.5\ eV<\chi<2.5\ eV$.

18. The method of claim 9, wherein the method includes:
  forming the open area as an open pillar in the material stack, the material stack including alternating isolation dielectrics and sacrificial regions for conductive regions;
  removing portions of the sacrificial regions, exposing portions of the dielectric barrier; and
  forming multiple gates on and contacting the exposed portions of the dielectric barrier, wherein multiple charge trap structures are formed in the material stack.

19. The method of claim 18, wherein the dielectric barrier, the blocking dielectric region, the charge trap region, the tunnel region, and the semiconductor material are formed as continuous regions between and through the multiple charge trap structures.

20. The method of claim 18, wherein forming the semiconductor material includes forming a doped hollow pillar of the semiconductor material in the open pillar.

* * * * *